US008816567B2

(12) United States Patent
Zuo et al.

(10) Patent No.: US 8,816,567 B2
(45) Date of Patent: Aug. 26, 2014

(54) PIEZOELECTRIC LATERALLY VIBRATING RESONATOR STRUCTURE GEOMETRIES FOR SPURIOUS FREQUENCY SUPPRESSION

(75) Inventors: Chengjie Zuo, San Diego, CA (US); Changhan Yun, San Diego, CA (US); Chi Shun Lo, San Diego, CA (US); Jonghae Kim, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 488 days.

(21) Appl. No.: 13/186,281

(22) Filed: Jul. 19, 2011

(65) Prior Publication Data
US 2013/0021305 A1    Jan. 24, 2013

(51) Int. Cl.
*H01L 41/04* (2006.01)
*H03H 3/02* (2006.01)
*H03H 9/02* (2006.01)
*H03H 9/17* (2006.01)

(52) U.S. Cl.
CPC .......... *H03H 9/02228* (2013.01); *H03H 3/02* (2013.01); *H03H 9/02055* (2013.01); *H03H 2003/021* (2013.01); *H03H 9/173* (2013.01)
USPC .......................................... 310/321; 310/365

(58) Field of Classification Search
USPC ................................ 310/320, 321
See application file for complete search history.

(56) References Cited

U.S. PATENT DOCUMENTS

| | | | | |
|---|---|---|---|---|
| 3,437,848 A | * | 4/1969 | Borner et al. | 310/320 |
| 3,517,350 A | * | 6/1970 | Beaver | 333/191 |
| 3,764,848 A | | 10/1973 | Berlincourt | |
| 3,833,825 A | * | 9/1974 | Haan | 310/320 |
| 4,076,987 A | | 2/1978 | Zumsteg | |
| 4,431,938 A | * | 2/1984 | Inoue | 310/348 |
| 4,490,641 A | | 12/1984 | Takeuchi et al. | |
| 4,503,350 A | * | 3/1985 | Nakatani | 310/321 |
| 4,803,449 A | | 2/1989 | Hikita et al. | |

(Continued)

FOREIGN PATENT DOCUMENTS

| | | |
|---|---|---|
| EP | 0356266 A1 | 2/1990 |
| EP | 0648015 A2 | 4/1995 |

(Continued)

OTHER PUBLICATIONS

International Search Report and Written Opinion—PCT/US2012/046242—ISA/EPO—Oct. 5, 2012.

(Continued)

*Primary Examiner* — J A. San Martin
(74) *Attorney, Agent, or Firm* — Weaver Austin Villeneuve & Sampson, LLP

(57) ABSTRACT

This disclosure provides implementations of electromechanical systems resonator structures, devices, apparatus, systems, and related processes. In one aspect, a resonator structure includes a first conductive layer of electrodes and a second conductive layer of electrodes. A piezoelectric layer including a piezoelectric material is disposed between the first conductive layer and the second conductive layer. One or more trenches can be formed in the piezoelectric layer on one or both sides in space regions between the electrodes. In some implementations, a process for forming the resonator structure includes removing an exposed portion of the piezoelectric layer to define a trench, for instance, by partial etching or performing an isotropic release etch using a $XeF_2$ gas or $SF_6$ plasma. In some other implementations, a portion of a sacrificial layer is removed to define a trench in the piezoelectric layer.

24 Claims, 23 Drawing Sheets

(56) References Cited

U.S. PATENT DOCUMENTS

| | | | |
|---|---|---|---|
| 5,091,671 A * | 2/1992 | Yoshida | 310/358 |
| 5,179,310 A | 1/1993 | Satoh et al. | |
| 5,241,291 A | 8/1993 | Blackburn | |
| 5,374,910 A | 12/1994 | Yamagata | |
| 5,463,361 A | 10/1995 | Allen | |
| 5,859,488 A * | 1/1999 | Okeshi et al. | 310/368 |
| 5,880,553 A | 3/1999 | Okeshi et al. | |
| 5,900,790 A * | 5/1999 | Unami et al. | 333/187 |
| 5,925,968 A | 7/1999 | Yachi et al. | |
| 5,973,442 A * | 10/1999 | Irie | 310/366 |
| 6,049,702 A | 4/2000 | Tham et al. | |
| 6,141,845 A | 11/2000 | Okeshi et al. | |
| 6,150,906 A | 11/2000 | Lee et al. | |
| 6,223,406 B1 * | 5/2001 | Takeshima et al. | 29/25.35 |
| 6,242,844 B1 | 6/2001 | Puttagunta et al. | |
| 6,285,866 B1 | 9/2001 | Lee et al. | |
| 6,300,708 B1 * | 10/2001 | Itasaka | 310/367 |
| 6,472,959 B1 | 10/2002 | Beaudin et al. | |
| 6,571,442 B1 | 6/2003 | Okeshi et al. | |
| 6,812,619 B1 | 11/2004 | Kaitila et al. | |
| 6,839,946 B2 | 1/2005 | Ylilammi et al. | |
| 6,967,432 B2 | 11/2005 | Mitani et al. | |
| 7,075,217 B2 | 7/2006 | Vazquez | |
| 7,161,283 B1 | 1/2007 | Geefay | |
| 7,262,674 B2 | 8/2007 | Kamgaing | |
| 7,299,529 B2 | 11/2007 | Ginsburg et al. | |
| 7,321,183 B2 | 1/2008 | Ebuchi et al. | |
| 7,323,805 B2 | 1/2008 | Sano et al. | |
| 7,370,396 B2 | 5/2008 | Namba et al. | |
| 7,382,217 B2 | 6/2008 | Morita et al. | |
| 7,408,287 B2 * | 8/2008 | Matsumoto et al. | 310/320 |
| 7,468,642 B2 | 12/2008 | Bavisi et al. | |
| 7,728,696 B2 | 6/2010 | Stuebing et al. | |
| 7,750,745 B2 | 7/2010 | Van Beek | |
| 7,791,432 B2 | 9/2010 | Piazza et al. | |
| 7,800,461 B2 | 9/2010 | Terada et al. | |
| 7,808,434 B2 | 10/2010 | White et al. | |
| 7,843,284 B2 | 11/2010 | Ayazi et al. | |
| 7,847,656 B2 | 12/2010 | Ayazi et al. | |
| 7,868,517 B2 | 1/2011 | Belot et al. | |
| 7,898,158 B1 | 3/2011 | Li et al. | |
| 7,915,974 B2 | 3/2011 | Piazza et al. | |
| 7,990,233 B2 | 8/2011 | Suzuki | |
| 8,497,747 B1 | 7/2013 | Wojciechowski et al. | |
| 2003/0009863 A1 | 1/2003 | Figueredo et al. | |
| 2003/0058066 A1 | 3/2003 | Taniguchi et al. | |
| 2004/0056563 A1 * | 3/2004 | Fujimoto | 310/321 |
| 2005/0181572 A1 | 8/2005 | Verhoeven et al. | |
| 2005/0200432 A1 | 9/2005 | Inoue et al. | |
| 2005/0237131 A1 | 10/2005 | Chang et al. | |
| 2005/0242903 A1 | 11/2005 | Inoue et al. | |
| 2006/0055287 A1 | 3/2006 | Kawakubo et al. | |
| 2006/0097823 A1 | 5/2006 | Fujii et al. | |
| 2007/0252485 A1 | 11/2007 | Kawakubo et al. | |
| 2008/0156624 A1 | 7/2008 | Kim et al. | |
| 2008/0252397 A1 | 10/2008 | Stuebing et al. | |
| 2008/0272853 A1 | 11/2008 | Heinze et al. | |
| 2009/0072663 A1 * | 3/2009 | Ayazi et al. | 310/320 |
| 2009/0102316 A1 | 4/2009 | Belot et al. | |
| 2009/0134953 A1 | 5/2009 | Hunt et al. | |
| 2009/0189716 A1 | 7/2009 | Lu et al. | |
| 2009/0206955 A1 | 8/2009 | Iizawa | |
| 2010/0086163 A1 | 4/2010 | Lorenz | |
| 2010/0127795 A1 | 5/2010 | Bauer et al. | |
| 2010/0187948 A1 | 7/2010 | Sinha et al. | |
| 2012/0050236 A1 | 3/2012 | Lo et al. | |
| 2012/0274647 A1 | 11/2012 | Lan et al. | |
| 2013/0021304 A1 | 1/2013 | Zuo et al. | |
| 2013/0120081 A1 | 5/2013 | Zuo et al. | |
| 2013/0120415 A1 | 5/2013 | Zuo et al. | |
| 2014/0035702 A1 | 2/2014 | Black et al. | |

FOREIGN PATENT DOCUMENTS

| | | | |
|---|---|---|---|
| EP | 1253713 A2 | 10/2002 | |
| EP | 1901426 A1 | 3/2008 | |
| GB | 2037070 A | 7/1980 | |
| JP | 61092011 | 5/1986 | |
| JP | 63120481 A | 5/1988 | |
| JP | 10270974 | 10/1998 | |
| JP | 2006101103 A | 4/2006 | |
| WO | 2004075402 A1 | 9/2004 | |
| WO | 2005099110 A2 | 10/2005 | |
| WO | 2008108193 A1 | 9/2008 | |
| WO | 2009000815 A1 | 12/2008 | |
| WO | WO2010138243 A1 | 12/2010 | |
| WO | WO2012148712 | 11/2012 | |

OTHER PUBLICATIONS

International Search Report and Written Opinion—PCT/US2012/046293—ISA/EPO—Oct. 15, 2012.

Perez C.R., et al., "Bandwidth Control in Acoustically Coupled AIN Contour Mode MEMS Filters", Frequency Control Symposium, 2009 Joint With the 22ND European Frequency and Time Forum. IEEE International, IEEE, Piscataway, NJ, USA, Apr. 20, 2009, pp. 64-69, XP031492340.

Piazza G., et al., "One and two port piezoelectric higher order contour-mode MEMS resonators for mechanical signal processing", Solid State Electronics, Elsevier Science Publishers, Barking, GB, vol. 51, No. 11-12, Nov. 19, 2007, pp. 1596-1608, XP022360463, ISSN: 0038-1101, DOI: 10.1016/J.SSE.2007.09.037.

Volatier et al. "UHFNHF Resonators using Lamb Waves Co-Integrated with Bulk Acoustic Wave resonators "Proceedings of IEEE 2005 Ultrasonics Symposium pp. 902-905.

Bradley, et al., "4D-1 A 6-Port Film Bulk Acoustic Resonator (FBAR) Multiplexer for U.S. CDMA Handsets Permitting use of PCS, Cellband, and GPS with a Single Antenna," IEEE Ultrasonics Symposium, 2006, pp. 325-328.

Bradley P. D. et al., "A 5 mm × 5 mm × 1.37 mm Hermetic FBAR Duplexer for PCS Handsets with Wafer-Scale Packaging," 2002 IEEE Ultrasonics Symposium, 2002, pp. 931-934.

International Search Report and Written Opinion—PCT/US2012/033609—ISA/EPO—Jun. 14, 2012 (101935WO).

Krishnaswamy, et al., "Film bulk acoustic wave resonator technology," Proc. IEEE Ultrasonics Symposium 1990, vol. 1, pp. 529-536.

Lee, et al., "The Surface/Bulk Micromachining (SBM) Process: A New Method for Fabricating Released MEMS in Single Crystal Silicon," Journal of Microelectromechanical Systems, 1999, vol. 8 (4), 409-416.

Morita Takao et al., "Wideband Low Loss Double Mode Saw Filters" in Proc. IEEE Ultrasonics Symposium 1992, pp. 95-104.

Park H. S. et al., "Newly Developed High Q FBAR with Mesa-Shaped Membrane," (Sep. 2006) Proceedings of the 36th European Microwave conference 1281-1283.

Piazza G. et al., "One and Two Port Piezoelectric Contour-Mode MEMS Resonators for Frequency Synthesis," (Sep. 2006) Proceeding of the European Solid-State Devices Research Conference (ESSDERC).

White et al., "Design of nano-gap piezoelectric resonators for mechanical RF magnetic field modulation", Sensors and Actuators A, Elsevier Sequoia S.A., Lausanne, CH, vol. 134, No. 1, Feb. 28, 2007, pp. 239-244, XP005914413, ISSN: 0924-4247, DOI: 10.1016/J.SNA.2006.05.029 figures 6.7.

Wojciechowski K.E. et al., "Parallel Lattice Filters Utilizing Aluminum Nitride Contour Mode Resonators," Solid-State Sensors Actuators and Microsystems Workshop Jun. 6-10, 2010, pp. 65-69.

Zuo C. et al., "Very High Frequency Channel-Select MEMS Filters Based on Self-Coupled Piezoelectric AIN Contour-Mode Resonators," Sensors and Actuators A, 160 (2010) 132-140.

Pan W., et al., "A Comparison Between Tunable FBARs with an Integrated and with a Discrete Variable MEMS Capacitor", Micro Electro Mechanical Systems, 2006, MEMS 2006 Istanbul. 19TH IEEE International Conference on Istanbul, Turkey Jan. 22-26, 2006, IEEE, Piscataway, NJ, USA, Jan. 22, 2006, pp. 902-905, XP010914392.

(56) References Cited

OTHER PUBLICATIONS

Goldsmith C.L. et al., "RF Mems Variable Capacitors for Tunable Filters," International Journal of RF and Microwave Computer Aided Engineering, Wiley Interscience, vol. 9(4), Jul. 1, 1999. pp. 362-374.

Isobe, A., et al., "Radial Extensional Mode AlN-Film Resonator With High Coupling Factor", Ultrasonics Symposium (IUS), 2010 IEEE, IEEE, Oct. 11, 2010, pp. 1277-1280, XP031952575, DOI: 10.1109/ULTSYM.2010.5935436, ISBN: 978-1-4577-0382-9.

Khine L., et al., "Piezoelectric ALN Mems Reasonators with high coupling coefficient," Transducers, 2011, pp. 526-529.

Wojciechowski K, E., et al., "Single-Chip Precision Oscillators Based on Multi-Frequency, High-Q Aluminum Nitride MEMS Resonators", Solid-State Sensors, Actuators and Microsystems Conference, 2009, Transducers 2009, International, IEEE, Piscataway, NJ, USA, Jun. 21, 2009, pp. 2126-2130, XP031545537, ISBN: 978-1-4244-4190-7.

Zuo C., et al., "Power Handling and Related Frequency Scaling Advantages in Piezoelectric AlN Contour-Mode MEMS Resonators," IEEE International Ultrasonics Symposium Proceedings, 2009, pp. 1187-1190.

\* cited by examiner

US 8,816,567 B2

PIEZOELECTRIC LATERALLY VIBRATING RESONATOR STRUCTURE GEOMETRIES FOR SPURIOUS FREQUENCY SUPPRESSION

TECHNICAL FIELD

This disclosure relates generally to resonators and more specifically to electromechanical systems piezoelectric resonators.

DESCRIPTION OF THE RELATED TECHNOLOGY

Electromechanical systems include devices having electrical and mechanical elements, transducers such as actuators and sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography, and/or other micromachining processes that etch away parts of substrates and/or deposited material layers, or that add layers to form electrical, mechanical, and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Various electronic circuit components can be implemented at the electromechanical systems level, such as resonators. Some conventional resonator structures provide less than desirable electrical and mechanical energy conversion. In some resonator designs, the efficiency of this electromechanical coupling is based on the effectiveness of translation of electrical energy, from an input electrical signal delivered to an input terminal, to mechanical motion of a piezoelectric material that is translated back to electrical energy at the input terminal or an output terminal. Conventional resonator devices having poor electromechanical coupling can have sub-optimal operational efficiency and signal throughput.

Some layouts and configurations of conventional resonator structures allow for spurious modes of vibration, that is, the resonator vibrating at other frequencies than the desired resonant frequency. Spurious modes of vibration can result in the transmission of spurious frequencies, for example, frequencies outside of a designated pass band in a circuit in which the resonator is incorporated. Spurious frequencies can be undesirable, for instance, when the resonator is implemented as a bandpass filter. Spurious modes of vibration can limit the out-of-band rejection capabilities of the resonator for various applications.

SUMMARY

The structures, devices, apparatus, systems, and processes of the disclosure each have several innovative aspects, no single one of which is solely responsible for the desirable attributes disclosed herein.

Disclosed are implementations of electromechanical systems resonator structures, such as contour mode resonators (CMR), devices, apparatus, systems, and related fabrication processes.

According to one innovative aspect of the subject matter described in this disclosure, a resonator structure includes a first conductive layer of electrodes disposed along an X axis. A second conductive layer of electrodes is disposed along the X axis and offset from the first conductive layer along a Z axis perpendicular to the X axis. A piezoelectric layer including a piezoelectric material is disposed between the first conductive layer and the second conductive layer. The piezoelectric layer has a first side and a second side opposite the first side. The first side is proximate the first conductive layer, and the second side is proximate the second conductive layer. One or more trenches are formed in the piezoelectric layer on the first side in one or more respective space regions between the electrodes of the first conductive layer.

In some implementations, the trenches define elevated regions on the first side of the piezoelectric layer, where the elevated regions are aligned with the electrodes of the first conductive layer. The piezoelectric layer has a first height along the Z axis in one of the elevated regions and a second height along the Z axis in one of the space regions. The first height can be larger than the second height. The first height and the second height of the piezoelectric layer can define a designated height differential.

According to another innovative aspect of the subject matter described in this disclosure, a process for forming a resonator structure includes depositing a sacrificial layer on a substrate. A lower electrode layer is formed on the sacrificial layer. A piezoelectric layer is deposited on the lower electrode layer. An upper electrode layer is formed on the piezoelectric layer. The upper electrode layer includes a space region and an electrode region. An exposed portion of the piezoelectric layer in the space region is removed to define a trench in the piezoelectric layer. At least a portion of the sacrificial layer is removed to define a cavity such that at least a portion of the lower electrode layer is spaced apart from the substrate.

In some implementations, removing the exposed portion of the piezoelectric layer includes partially etching the exposed portion of the piezoelectric layer to define the trench in the piezoelectric layer. In some implementations, removing the portion of the sacrificial layer includes performing an isotropic release etch on the sacrificial layer. The isotropic release etch can include providing a $XeF_2$ gas or $SF_6$ plasma to the sacrificial layer.

According to another innovative aspect of the subject matter described in this disclosure, a process for forming a resonator structure includes depositing a first sacrificial layer on a substrate. A lower electrode layer is formed on the first sacrificial layer. The lower electrode layer includes an electrode region and a space region exposing a portion of the first sacrificial layer. A second sacrificial layer is formed on the space region of the lower electrode layer. A piezoelectric layer is deposited on the lower electrode layer and the second sacrificial layer. An upper electrode layer is formed on the piezoelectric layer. At least a portion of the first sacrificial layer is removed to define a cavity such that at least a portion of the lower electrode layer is spaced apart from the substrate. A portion of the second sacrificial layer is removed to define a trench in the piezoelectric layer.

According to another innovative aspect of the subject matter described in this disclosure, a resonator structure includes a first conductive means of electrodes disposed along an X axis. A second conductive means of electrodes is disposed along the X axis and offset from the first conductive means along a Z axis perpendicular to the X axis. A piezoelectric means is disposed between the first conductive means and the second conductive means. The piezoelectric means has a first side and a second side opposite the first side. The first side is proximate the first conductive means, and the second side is proximate the second conductive means. One or more trenches are formed in the piezoelectric means on the first side in one or more respective space regions between the electrodes of the first conductive means.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
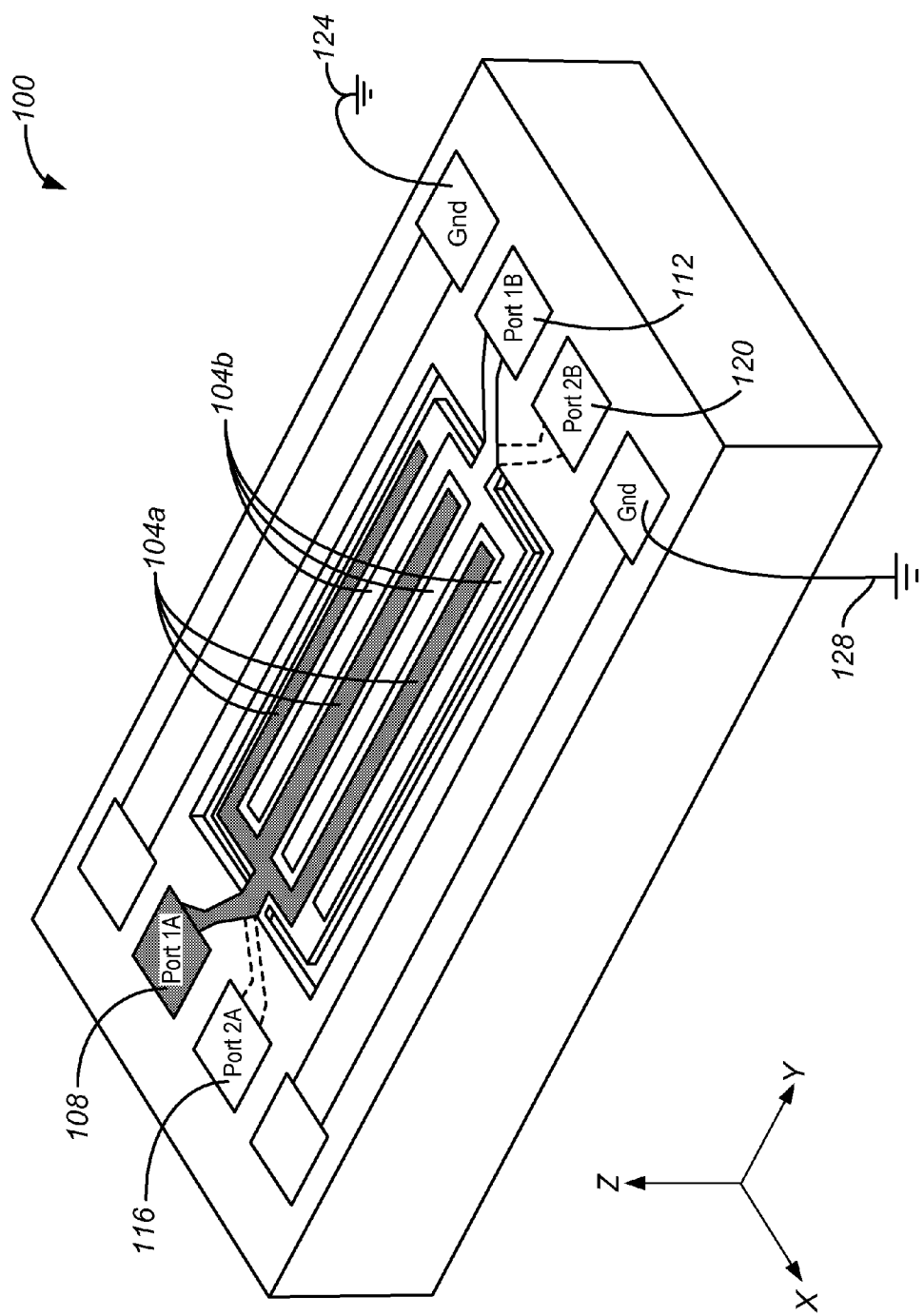
FIG. 1 shows an example of a perspective view of a contour mode resonator (CMR) device.

The following detailed description is directed to certain implementations for the purposes of describing the innovative aspects. However, the teachings herein can be applied in a multitude of different ways.

The disclosed implementations include examples of structures and configurations of electromechanical systems resonator devices, such as contour mode resonators (CMR). Related apparatus, systems, and fabrication processes and techniques are also disclosed. CMRs are referred to as "contour mode" because of their substantially lateral and in-plane mode of vibration, as described in greater detail below. In the case of piezoelectric resonators, electrodes are generally disposed in contact with or in proximity to a piezoelectric material. For instance, the electrodes can be located on the same surface or on opposite surfaces of a layer of the piezoelectric material. An electric field applied between electrodes is transduced into a mechanical strain in the piezoelectric material. For instance, a time-varying electrical signal can be provided to an input electrode of the CMR and transduced to a corresponding time-varying mechanical motion. A portion of this mechanical energy can be transferred back to electrical energy at the input electrode or at a separate output electrode. The frequency of the input electrical signal that produces the greatest substantial amplification of the mechanical displacement in the piezoelectric material is generally referred to as a resonant frequency of the CMR.

In one or more implementations of the disclosed CMRs, the resonator structure is suspended in a cavity of a supporting structure and generally includes two conductive electrode layers, with a layer of piezoelectric material sandwiched between the two electrode layers. The resonator structure can be suspended in the cavity by specially designed tethers coupling the resonator structure to the supporting structure, as further explained below. These tethers are often fabricated in the layer stack of the resonator structure itself. The resonator structure can be acoustically isolated from the surrounding structural support and other apparatus by virtue of the cavity.

Some implementations described herein are based on a contour mode resonator configuration. In such implementations, the resonant frequency of a CMR can be substantially controlled by engineering the lateral dimensions of the piezoelectric material and electrodes. One benefit of such a construction is that multi-frequency RF filters, clock oscillators, transducers or other devices, each including one or more CMRs depending on the desired implementation, can be fabricated on the same substrate. For example, this may be advantageous in terms of cost and size by enabling compact, multi-band filter solutions for RF front-end applications on a single chip. In some examples, by co-fabricating multiple CMRs with different finger widths, as described in greater detail below, multiple frequencies can be addressed on the same die. In some examples, arrays of CMRs with different frequencies spanning a range from MHz to GHz can be fabricated on the same substrate.

With the disclosed CMRs, direct frequency synthesis for spread spectrum communication systems may be enabled by multi-frequency narrowband filter banks including high quality (Q) resonators, without the need for phase locked loops. The disclosed CMR implementations can provide for piezoelectric transduction with low motional resistance while maintaining high Q factors and appropriate reactance values that facilitate their interface with contemporary circuitry. Some examples of the disclosed laterally vibrating resonator structures provide the advantages of compact size, e.g., on the order of 100 um (micrometers) in length and/or width, low power consumption, and compatibility with high-yield mass-producible components.

The disclosed techniques involve engineering the cross-sectional geometry of a resonator structure. In some implementations, recesses can be formed in exposed regions of piezoelectric material between electrodes on one or both sides of a resonator structure. For example, trenches can be created to define elevated regions of the piezoelectric material under the electrodes of a conductive layer disposed on the piezoelectric material. In some implementations, an extra patterning and etching operation can be performed on a surface of the resonator structure to form the trenches. The electrodes can serve as a mask, or another mask operation can be added to the fabrication process. In some other implementations, a sacrificial layer can be provided in spaces between the electrodes before depositing the piezoelectric material in fabrication. The sacrificial layer can be removed to define recesses in the piezoelectric material. The depth of the trenches and, accordingly, the height differential in regions of the piezoelectric layer can be designed to substantially eliminate or suppress any spurious vibrations.

Particular implementations of the subject matter described in this disclosure can be implemented to realize one or more of the following potential advantages. Spurious modes of vibration in a resonator can be substantially suppressed by engineering the cross-sectional geometry of the resonator structure as described herein. The resonator geometry can be controlled such that certain periodicity is created or enhanced for a certain desired mode or modes of vibration of the structure, while other undesired spurious modes of vibration, e.g., standing acoustic waves, are simultaneously prevented. By suppressing the spurious modes, the Q and electromechanical coupling coefficient ($kt^2$) of the desired modes can be enhanced.

The disclosed resonator structures can be fabricated on a low-cost, high-performance, large-area insulating substrate, which, in some implementations, forms at least a portion of the supporting structure described herein. In some implementations, the insulating substrate on which the disclosed resonator structures are formed can be made of display grade glass (alkaline earth boro-aluminosilicate) or soda lime glass. Other suitable insulating materials of which the insulating substrate can be made include silicate glasses, such as alkaline earth aluminosilicate, borosilicate, modified borosilicate, and others. Also, ceramic materials such as aluminum oxide (AlOx), yttrium oxide ($Y_2O_3$), boron nitride (BN), silicon carbide (SiC), aluminum nitride (AlNx), and gallium nitride (GaNx) can be used as the insulating substrate material. In some other implementations, the insulating substrate is formed of high-resistivity silicon. In some implementations, silicon On Insulator (SOI) substrates, gallium arsenide (GaAs) substrates, indium phosphide (InP) substrates, and plastic (polyethylene naphthalate or polyethylene terephthalate) substrates, e.g., associated with flexible electronics, also can be used. The substrate can be in conventional Integrated Circuit (IC) wafer form, e.g., 4-inch, 6-inch, 8-inch, 12-inch, or in large-area panel form. For example, flat panel display substrates with dimensions such as 370 mm×470 mm, 920 mm×730 mm, and 2850 mm×3050 mm, can be used.

In some implementations, the disclosed resonator structures are fabricated by depositing a sacrificial (SAC) layer on the substrate; forming a lower electrode layer on the SAC layer; depositing a piezoelectric layer on the lower electrode layer; forming an upper electrode layer on the piezoelectric layer; and removing at least part of the SAC layer to define a cavity. The resulting resonator cavity separates at least a portion of the lower electrode layer from the substrate and provides openings along the sides of the resonator structure, as illustrated in the accompanying figures, to allow the resonator to vibrate and move in one or more directions with substantial elastic isolation from the remaining substrate. In some other implementations, a portion of the substrate itself serves as a SAC material. In these implementations, designated regions of the insulating substrate below the resonator structure can be removed, for example, by etching to define the cavity.

FIG. 1 shows an example of a perspective view of a CMR device. In FIG. 1, a CMR structure 100 includes an upper conductive layer of electrodes 104a and 104b. The first electrodes 104a are connected to a first input port 108, referred to as "Port 1A." The second electrodes 104b are connected to a first output port 112, referred to as "Port 1B." A lower conductive layer of electrodes is situated underneath the upper conductive layer on the opposite side of a sandwiched piezoelectric layer, as described below. In one example, the lower conductive layer includes a similar arrangement of first electrodes underlying the first electrodes 104a of the upper conductive layer and connected to a port 116, referred to as "Port 2A," and a similar arrangement of second electrodes underlying the second electrodes 104b of the upper conductive layer and connected to a port 120, referred to as "Port 2B." In some implementations, port 116 is configured as a second input port, while port 120 is configured as a second output port. In some other implementations, port 116 serves as the second output port, and port 120 serves as the second input port.

In FIG. 1, as further described below, the ports 108, 112, 116 and 120 can have different configurations. For instance, Ports 2A and 2B can be coupled to ground terminal 124 and/or ground terminal 128, thus grounding the lower conductive layer of electrodes, while an input electrical signal can be provided to Port 1A, resulting in an output electrical signal being provided to port 1B. In another configuration, a first input signal can be provided to Port 1A, and a second input signal can be provided to Port 2A, responsive to which a first output signal can be delivered to Port 1B, and a second output signal can be delivered to Port 2B. The piezoelectric layer disposed between the upper conductive layer and the lower conductive layer translates the input signal(s) to mechanical vibration, which can then be translated to the output signal(s).

In the example of FIG. 1, the electrodes in the respective conductive layers have longitudinal axes substantially oriented along a Y axis, illustrated in FIG. 1. The X, Y and Z axes of FIG. 1 and additional figures described below are provided for reference and illustrative purposes only. In this example, the electrodes are generally straight along their longitudinal axes, although the electrodes can be curved, i.e., have arced contours, be angled, or have other geometries, depending on the desired implementation. Elongated electrodes having any of these various shapes are sometimes referred to herein as "fingers."

Figure 2A:
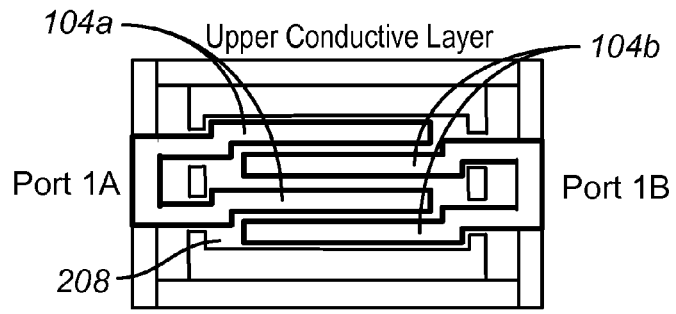
FIG. 2A shows an example of a top view of a contour mode resonator (CMR) device.
Figure 2B:
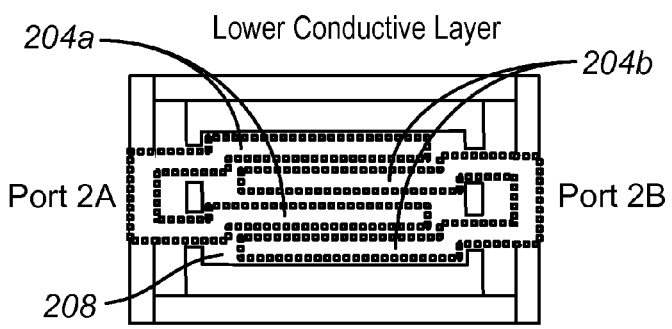
FIG. 2B shows an example of a bottom view of the CMR device of FIG. 2A.

FIG. 2A shows an example of a top view of a CMR device. FIG. 2B shows an example of a bottom view of the CMR device of FIG. 2A. In FIG. 2A, two first electrodes 104a are interdigitated with two second electrodes 104b in the upper conductive layer, like the arrangement in FIG. 1. Unlike FIG. 1, in FIGS. 2A and 2B, each of the first electrodes 104a is connected to Port 1A by a respective connecting member, as further explained below with reference to FIG. 4. Separate connecting members are similarly incorporated to establish connections between respective second electrodes 104b and Port 1B. As shown in the bottom view of the CMR device in FIG. 2B, the lower conductive layer includes a corresponding arrangement of first electrodes 204a interdigitated with second electrodes 204b. In some examples, some or all of the first electrodes 104a and 204a of the respective conductive layers are aligned with one another, that is, along the Z axis of FIG. 1, while separated by piezoelectric layer 208. In such instances, the same can be true for the second electrodes 104b and 204b. In some other examples, some or all of the first electrodes 104a and 204a of the respective conductive layers are offset from one another along the Z axis of FIG. 1. For instance, second electrodes 204b can be underlying first electrodes 104a, while first electrodes 204a are underlying second electrodes 104b.

Figure 2C:
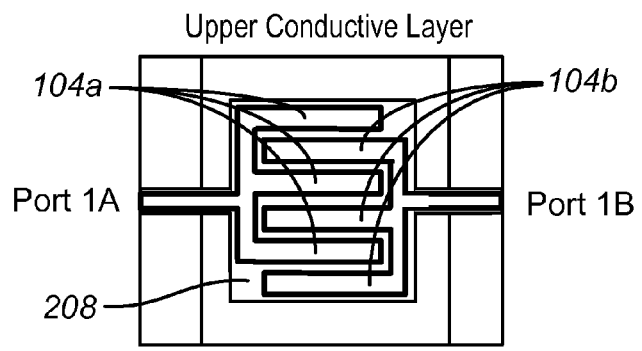
FIG. 2C shows an example of a top view of a CMR device.
Figure 2D:
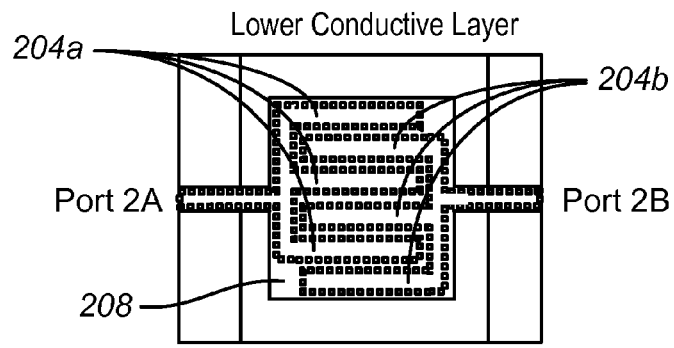
FIG. 2D shows an example of a bottom view of the CMR device of FIG. 2C.

FIG. 2C shows an example of a top view of a CMR device. FIG. 2D shows an example of a bottom view of the CMR device of FIG. 2C. FIGS. 2C and 2D show that there can be additional first and second electrodes in the respective conductive layers, and the electrodes can have different lengths, widths, and spacings from those in FIGS. 2A and 2B. In the examples of FIGS. 2A-2D, the electrodes in the respective conductive layers are situated in a periodic arrangement and spaced apart from one another, for example, along the X axis of FIG. 1. Each set of electrodes 104a, 104b, 204a, and 204b, is connected to a respective port by a shared connecting member including tethers, as further explained below with reference to FIG. 3. In some examples, some or all of the first electrodes 104a and 204a of the respective conductive layers are aligned with one another, that is, along the Z axis of FIG. 1, while separated by piezoelectric layer 208. In such instances, the same can be true for the second electrodes 104b and 204b. In some other examples, some or all of the first electrodes 104a and 204a of the respective conductive layers are offset from one another along the Z axis of FIG. 1. For instance, second electrodes 204b can be underlying first electrodes 104a, while first electrodes 204a are underlying second electrodes 104b.

Figure 3:
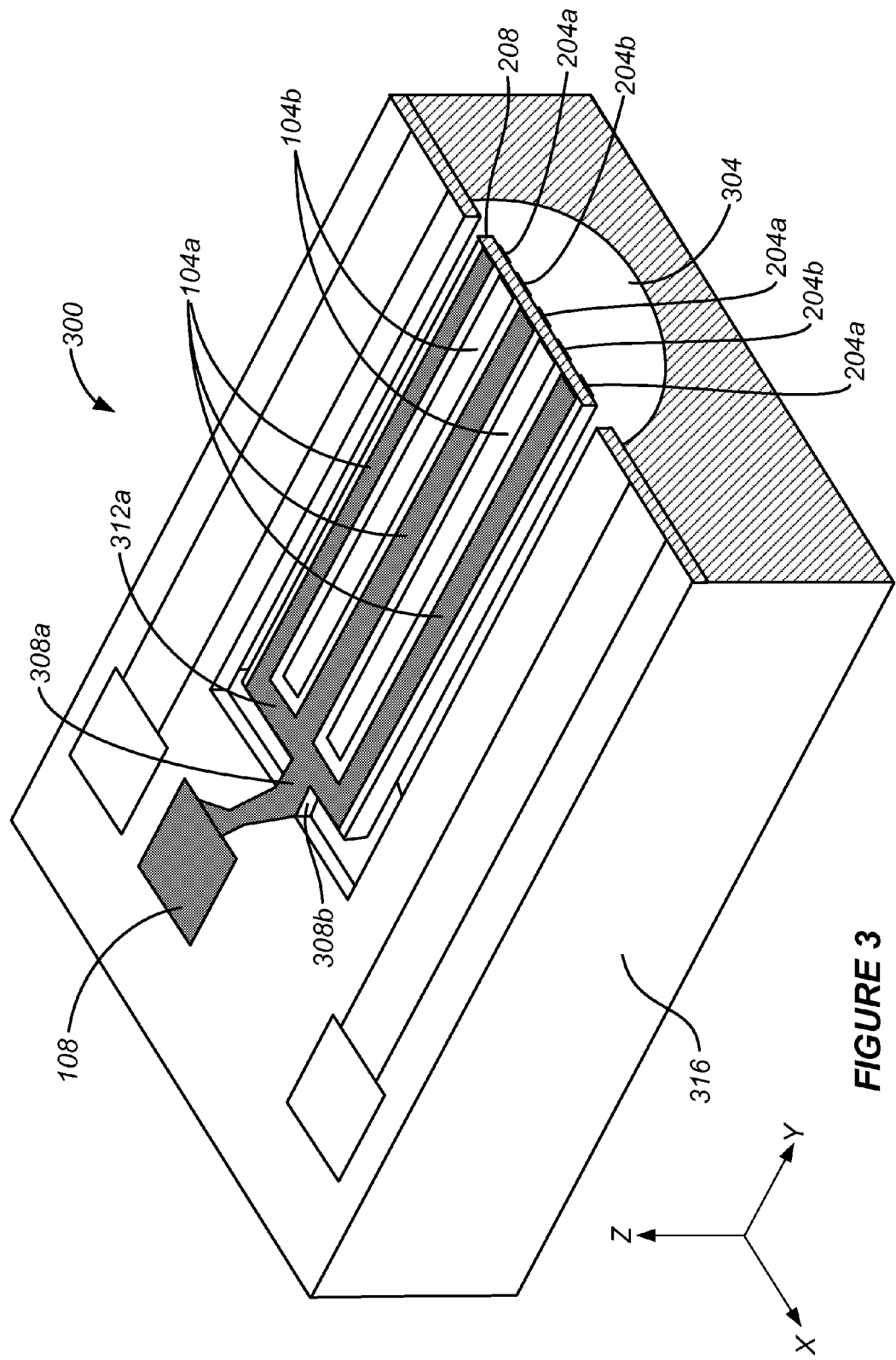
FIG. 3 shows an example of a perspective cross-sectional view of a CMR device.

FIG. 3 shows an example of a perspective cross-sectional view of a CMR device. In FIG. 3, a resonator structure 300 includes an upper conductive layer of electrodes 104a and 104b, piezoelectric layer 208, and lower conductive layer of electrodes 204a and 204b, as described above. The resonator structure 300 is suspended in a cavity 304 by virtue of tethers 308a and 308b, as well as a matching pair of tethers (not shown) connected at the opposite end of the CMR. In FIG. 3, the tethers serve as physical anchors to hold the resonator structure in the cavity. The resonator structure is capable of lateral motion by virtue of vibration of the piezoelectric material, that is, with respect to a plane oriented along the X and Y axes. The tether 308a is electrically coupled between the first electrodes 104a of the upper conductive layer and port 108, while the tether 308b is electrically coupled between the underlying first electrodes 204a of the lower conductive layer and another port, such as port 116 of FIG. 1. The matching pair of tethers on the opposite end of the structure can similarly electrically couple second electrodes 104b and 204b of the upper and lower layers to their respective ports as described in the example of FIG. 1 above. The tethers can be fabricated as extensions of their respective conductive layers and can be on the order of several microns wide, e.g., along the X axis. In some implementations, the tethers 308a and 308b are designed such that their length, e.g., along the Y axis of FIG. 1, is an integer number of resonant quarter wavelengths.

In the examples shown in FIGS. 2C, 2D and FIG. 3, each set of electrodes has an interconnect electrically coupled to a respective tether. For instance, in FIG. 3, interconnect 312a is coupled between the first electrodes 104a and the tether 308a. Thus, in some implementations, the tether 308a, the electrically coupled interconnect 312a, and the first electrodes 104a form an integral part of the upper conductive layer. Another part of the upper conductive layer includes a corresponding tether and interconnect coupled to the second electrodes 104b. The resonator structure is partially surrounded by an opening in the form of the cavity 304 and is coupled to supporting structure including a substrate 316, which supports the resonator structure, by virtue of the tethers.

In FIGS. 1-3, the resonator structures can include a pattern of metal electrodes in the upper and lower conductive layers that, when provided one or more electrical input signals, causes the piezoelectric layer to have a motional response. The motional response can include a vibrational oscillation along one or more of the X, Y and Z axes. The resonant frequency response of the CMR structure can be controlled according to a periodic arrangement of electrodes in the conductive layers, for instance, by adjusting the width(s) as well as the spacing(s) of the electrodes from one another in a conductive layer, e.g., along the X axis of FIG. 1, as further explained below.

In FIGS. 1-3, the pattern of interdigitated first electrodes and second electrodes of a conductive layer is periodic in one direction, for instance, along the X axis of FIG. 1. As illustrated, the periodic arrangement of electrodes 104a and 104b includes alternating areas of metal, representing electrode regions, and space regions, i.e., areas without metal. Such space regions between the electrodes are also referred to herein as "spaces." In various implementations, the areas of metal and the spaces have the same width, the areas of metal are wider than the spaces, the areas of metal are narrower than the spaces, or any other appropriate relation between the metal widths and spaces. The finger width of the CMR, a parameter based on a combination of electrode width and spacing, as described in greater detail below with reference to FIG. 4, can be adjusted to control one or more resonant frequencies of the structure. For instance, a first finger width in a conductive layer can correspond to a first resonant frequency of the CMR, and a second finger width in the conductive layer can provide a different second resonant frequency of the CMR.

The CMR structure can be driven into resonance by applying a harmonic electric potential that varies in time across the patterned conductive layers. The layout and interconnectivity of the periodic electrodes transduce the desired mode of vibration while suppressing the response of undesired spurious modes of vibration of the structure. For example, a specific higher order vibrational mode can be transduced without substantially transducing other modes. Compared to its response to a constant DC electric potential, the amplitude of the mechanical response of the resonator is multiplied by the Q factor (the typical Q factor is on the order of 500 to 5000). Engineering the total width of the resonator structure and the number of electrode periods provides control over the impedance of the resonator structure by scaling the amount of charge generated by the motion of the piezoelectric material.

Figure 4:
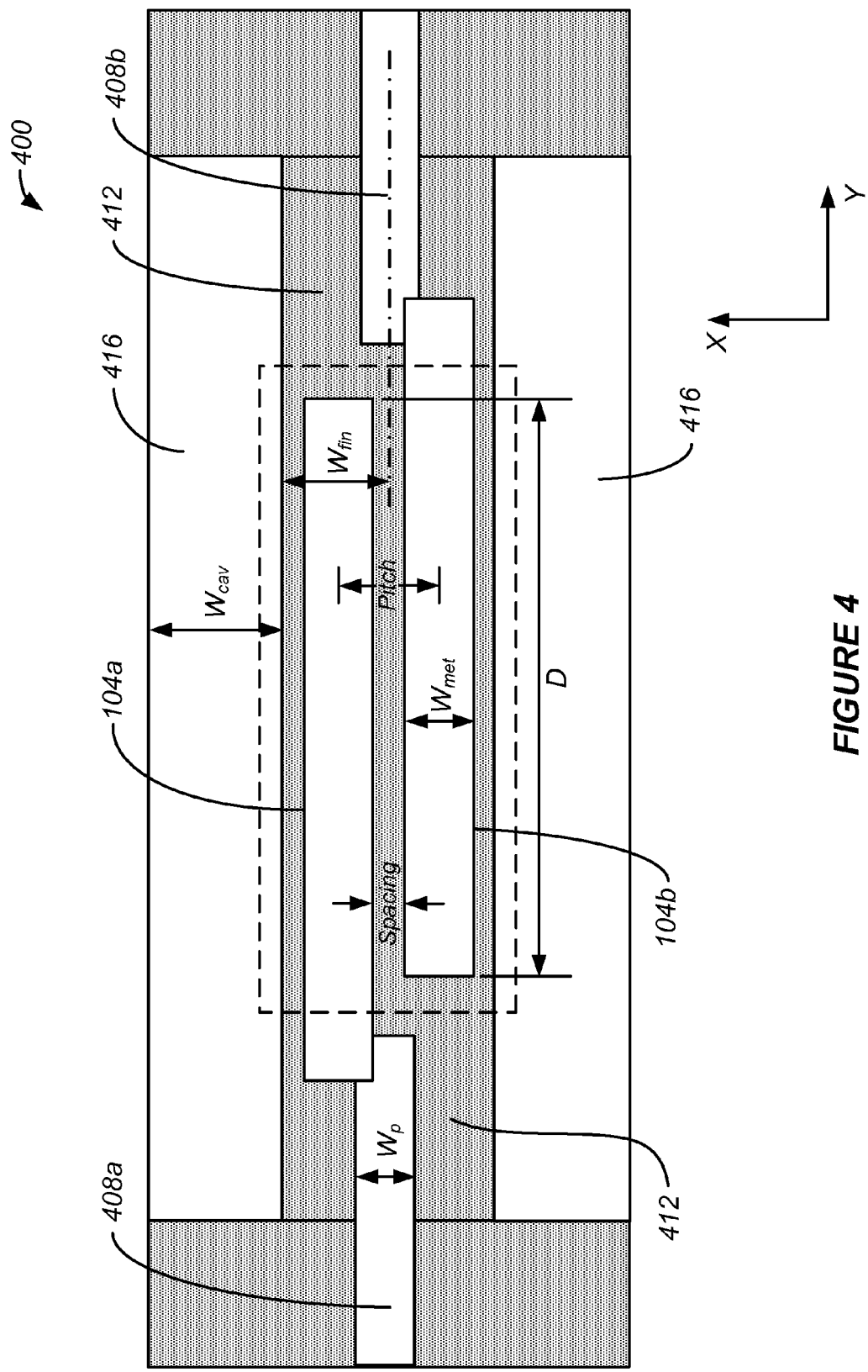
FIG. 4 shows an example of a top view of a resonator device.

FIG. 4 shows an example of a top view of a resonator device in accordance with one implementation. In the implementation of FIG. 4, a resonator structure 400 is configured as a CMR, with the electrodes in the respective conductive layers having longitudinal axes substantially parallel to one another and extending along the Y axis, as illustrated. A resonator structure generally has a finger width, Wfin, representing the width of each sub-resonator, which primarily includes one electrode and half of the width of the exposed piezoelectric material on either side of the one electrode along the X axis, for example, as shown in FIG. 4. The electrode width, that is, the width of an individual electrode, Wmet, is generally smaller than the finger width, to limit the feed-through capacitance between electrodes. The pitch of the resonator structure generally refers to the distance between mid-points of electrodes along the X axis, as shown in FIG. 4. The spacing of electrodes refers to the gap between the edges of adjacent electrodes along the X axis, as shown in FIG. 4. The resonant frequency of the resonator structures disclosed herein is primarily determined by the finger width or pitch. The electrode width and spacing have second-order effects on the frequency. The finger width and pitch are correlated with the electrode width and spacing parameters, by definition. Pitch is often equal to finger width, as shown in the example of FIG. 4.

In FIG. 4, in one example, the upper electrodes 104a and 104b have an electrode width along the X axis, Wmet, of 4.8 um. Connecting members 408a and 408b, which can include tethers in some examples, are coupled to the respective electrodes 104a and 104b. The connecting members 408a and 408b have a connecting member width, Wp, which can be smaller than Wmet in this example. In other instances, Wp is the same size or larger than Wmet, depending on the desired configuration. The finger width of the electrodes, Wfin, which corresponds to the half-width of the piezoelectric layer 412 in this example, is 6.4 um. Wcav, the cavity width of cavity 416 along the X axis can be an integer multiple of Wfin, such as 2*Wfin (e.g., 12.8 um) or other measurement. Thus, in this instance, Wcav is approximately the same as the full piezoelectric layer width. In this example, a distance D, in which the upper electrodes 104a and 104b are adjacent to one another, can be on the order of 128 um or 256 um, by way of example.

Figure 5:
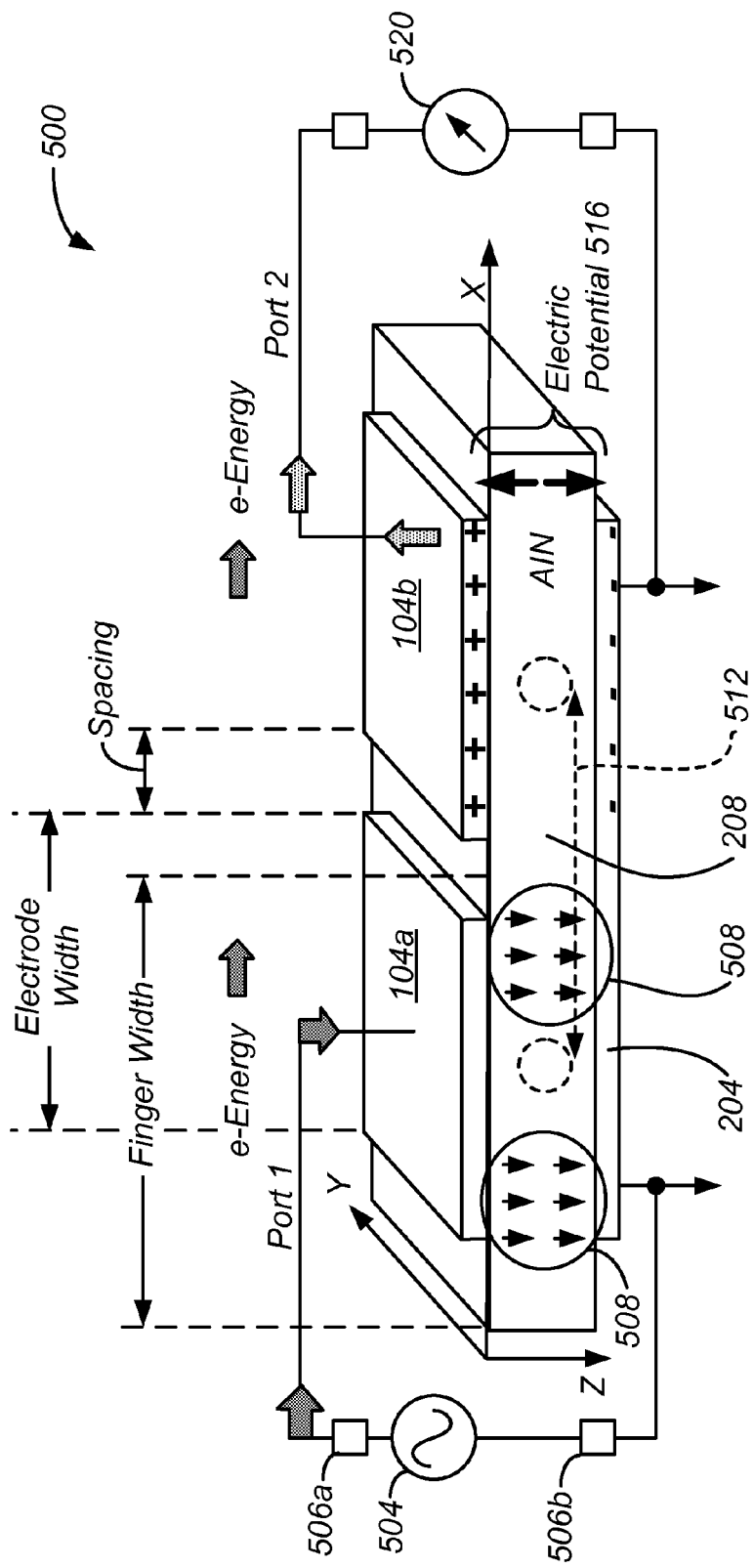
FIG. 5 shows an example of a perspective cross-sectional view of a resonator structure.

FIG. 5 shows an example of a perspective cross-sectional view of a resonator structure. In FIG. 5, the resonator structure 500 includes an upper conductive layer of electrodes 104a and 104b, a piezoelectric layer 208, and a lower conductive layer in the form of a single electrode 204, with the layers stacked as described above. In FIG. 5, there is an input port, "Port 1," at which an input electrical signal can be delivered to first electrode 104a of the upper conductive layer. Port 1 can be coupled to receive the input electrical signal from various components, such as an amplifier or an antenna. In the illustration of FIG. 5, an alternating current (AC) voltage source 504 simulates the electrical signal delivered by such a component. The AC voltage source 504 has a first terminal 506a coupled to Port 1 and a second terminal 506b coupled to the lower electrode 204, which is coupled to ground in this example. In this way, an input AC signal can be provided from voltage source 504 to Port 1 and, hence, to first electrode 104a of the resonator. An electric field caused by the alternating voltage of the AC signal is applied across the thickness of the piezoelectric layer 208, illustrated by arrows 508 in FIG. 5. The thickness of the structure 500 is generally measured along the Z axis, and the length is measured along the Y axis, in the example of FIG. 5. The total width, referring to the width of the overall structure 500, as well as finger width, spacing, and electrode width are measured along the X axis, in the example of FIG. 5. The electric field 508 is applied in a manner to transduce mechanical resonance such that piezoelectric layer 208 experiences displacement back and forth along the X, Y and Z axes. This includes lateral displacement, that is, back and forth along the width and length of the structure, in this example, substantially along the respective X and Y axes of FIG. 5.

FIG. 5 illustrates a two-port structure with the second electrode 104b coupled to Port 2, which represents an output port in this configuration. Some of the present CMR implementations leverage the lateral movement substantially back-and-forth along the width of the structure (X axis) as illustrated by arrows 512, although the transduction of energy in some other implementations can be based on movement along the length and/or thickness of the structure. The piezoelectric layer 208 of the disclosed resonators can vibrate and move in all dimensions at resonant frequencies, for instances, in planes oriented along the X and Y axes, X and Z axes, and Y and Z axes. In one example of a CMR, the electric field 508 is induced across piezoelectric layer 208 along the Z axis, causing extensional mechanical stress 512 in the piezoelectric layer along the width of the structure through piezoelectric mechanical coupling. This mechanical energy causes an electric potential 516 to be generated across second electrode 104b and lower electrode 204. This transduced potential is sensed as an output electrical signal at Port 2 and can be measured by one or more sensors 520 coupled between Port 2 and the grounded lower electrode 204.

The fundamental frequency for the displacement of the piezoelectric layer can be set in part lithographically by the planar dimensions of the upper electrodes, the lower electrode(s), and/or the piezoelectric layer. For instance, the resonator structures described above can be implemented by patterning the input electrodes and output electrodes of a respective conductive layer symmetrically, as illustrated in FIGS. 1-4. In the examples of FIGS. 1-4, an AC electric field applied across the upper and lower electrodes induces mechanical deformations in one or more planes of the piezoelectric layer via the d31 or d33 coefficient of the piezoelectric material, such as AlN. At the device resonant frequency, the electrical signal across the device is reinforced and the device behaves as an electronic resonant circuit.

In the present implementations, the resonant frequency of a CMR can be directly controlled by setting the finger width, as shown in FIG. 5. One benefit of such a control parameter is that multi-frequency filters can be fabricated on the same chip. CMR 500 has a resonant frequency associated with the finger width, which is based on the spacing in combination with the electrode width of electrodes 104a and 104b, that is, along the X axis. The finger width in a conductive layer of the CMR structure can be altered to adjust the resonant frequency. For instance, the resonant frequency is generally lowered as the finger width increases, and vice versa.

The total width, length, and thickness of the resonator structure are parameters that also can be designated to optimize performance. In some CMR implementations, the finger width of the resonator is the main parameter that is controlled to adjust the resonant frequency of the structure, while the total width multiplied by the total length of the resonator (total area) can be set to control the impedance of the resonator structure. In one example, in FIG. 5, the lateral dimensions, i.e., the width and length of resonator structure 500 can be on the order of several 100 microns by several 100 microns for a device designed to operate around 1 GHz. In another example, the lateral dimensions are several 1000 microns by several 1000 microns for a device designed to operate at around 10 MHz. A suitable thickness of the piezoelectric layer can be about 0.01 to 10 microns thick.

The pass band frequency can be determined by the layout of the resonator structure, as can the terminal impedance. For instance, by changing the shape, size and number of electrodes, the terminal impedance can be adjusted. In some examples, longer fingers along the Y axis of FIGS. 1, 4 and 5 yield smaller impedance. This, in turn, is inversely proportional to the capacitance of the CMR. The resonant frequencies of the CMR structures described herein are generally insensitive to the fabrication process, to the extent that the piezoelectric thickness and thicknesses of the conductive layers do not significantly impact the frequency. The impedance and the frequency can be controlled independently, since the length and the width/spacing of electrodes are in perpendicular directions.

Figure 6:
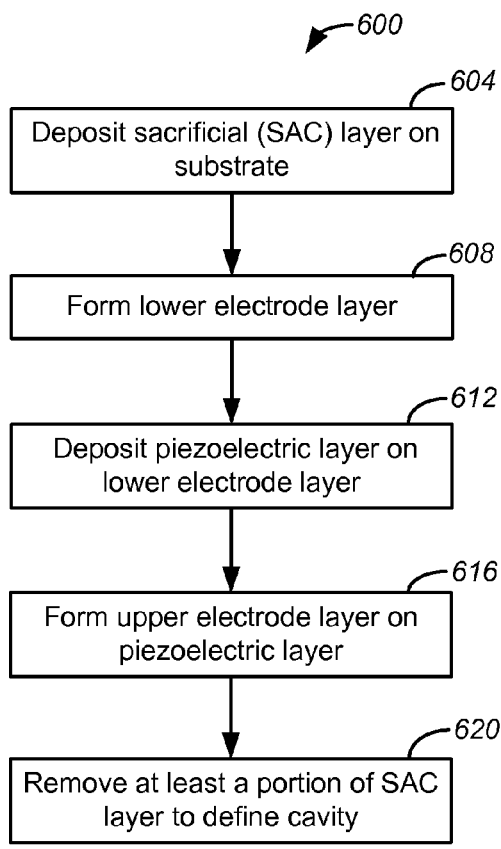
FIG. 6 shows an example of a flow diagram illustrating a process for forming a resonator structure.

FIG. 6 shows an example of a flow diagram illustrating a process for forming a resonator structure. In FIG. 6, the process 600 begins in block 604 in which a sacrificial (SAC) layer is deposited on a substrate. The SAC layer can have various shapes and sizes, and can be shaped to cover all or some portion of the substrate, depending on the desired implementation. In block 608, a lower electrode layer is formed on the SAC layer. The lower electrode layer is made of a conductive material such as metal and can be patterned to define one or more electrodes, depending on the desired configuration. When more than one electrode is defined, the electrodes can be connected at separate ports of the resonator device. In block 612, a piezoelectric layer is deposited on the lower electrode layer. In block 616, an upper electrode layer is then formed on the piezoelectric layer. The upper electrode layer also can be patterned to define more than one electrode. In some implementations, overlaying groups of electrodes can be defined in the upper and lower electrode layers on opposite surfaces of the piezoelectric layer. In block 620, part or all of the SAC layer is removed to define a cavity beneath the resonator structure.

Figure 7:
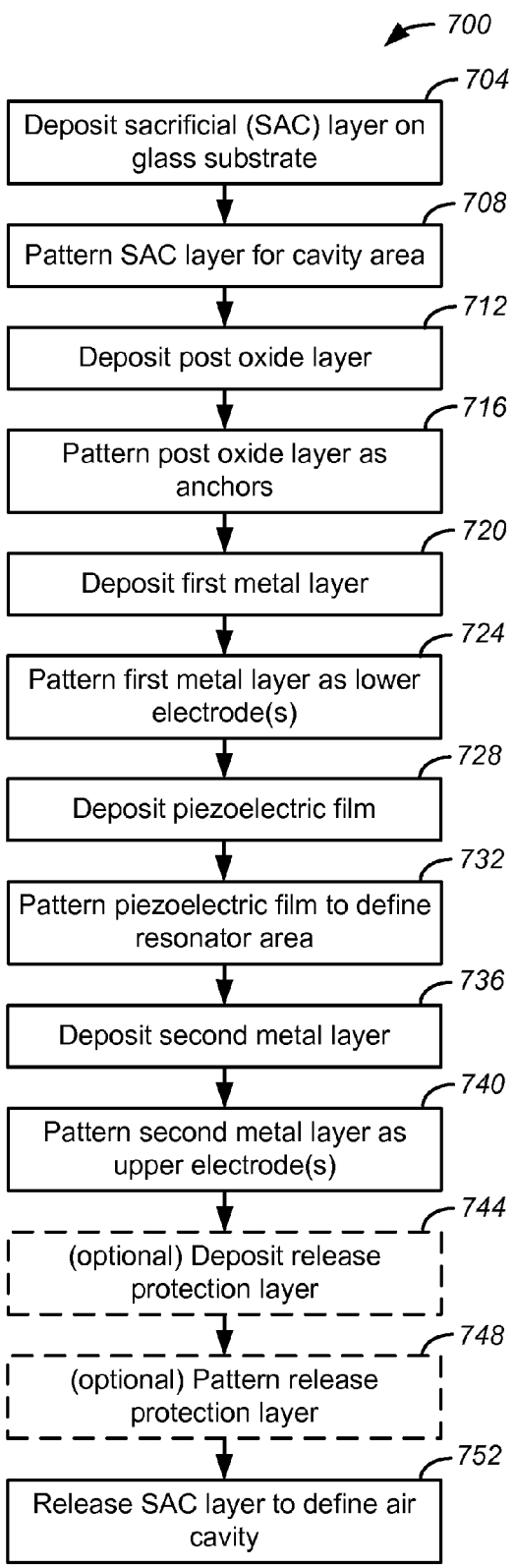
FIG. 7 shows an example of a flow diagram illustrating a process for forming a staggered resonator structure.

FIG. 7 shows an example of a flow diagram illustrating a process for forming a staggered resonator structure. FIGS. 8A-8G show examples of cross-sectional schematic illustrations of stages of staggered resonator fabrication in accordance with a process, for instance, as represented in FIG. 6 or FIG. 7. FIGS. 9A-9G show examples of perspective views of stages of staggered resonator fabrication in accordance with a process, for instance, as represented in FIG. 6 or FIG. 7.

Figure 8A:
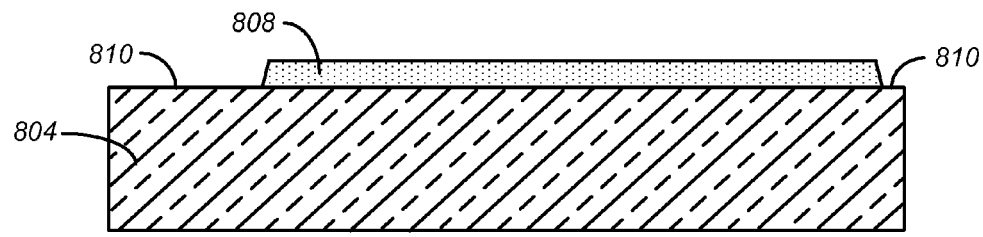
FIGS. 8A-8G show examples of cross-sectional schematic illustrations of stages of staggered resonator fabrication in accordance with a process, for instance, as represented in FIG. 6 or FIG. 7.
Figure 8B:
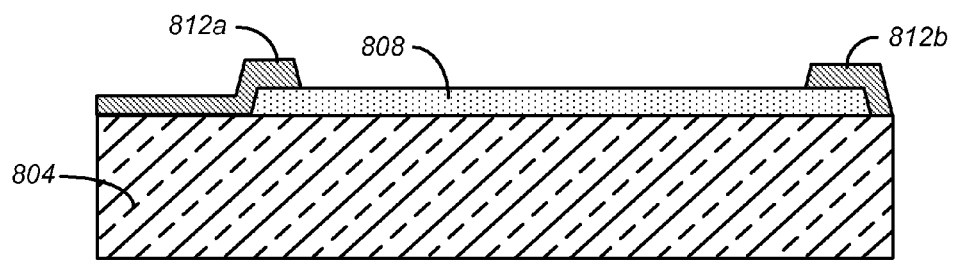
Figure 8C:
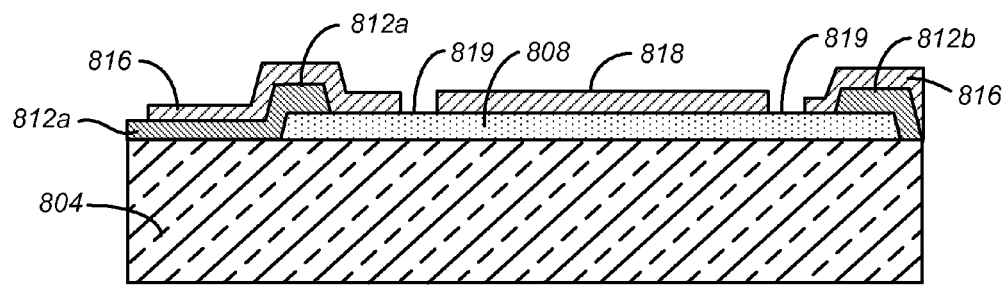
Figure 8D:
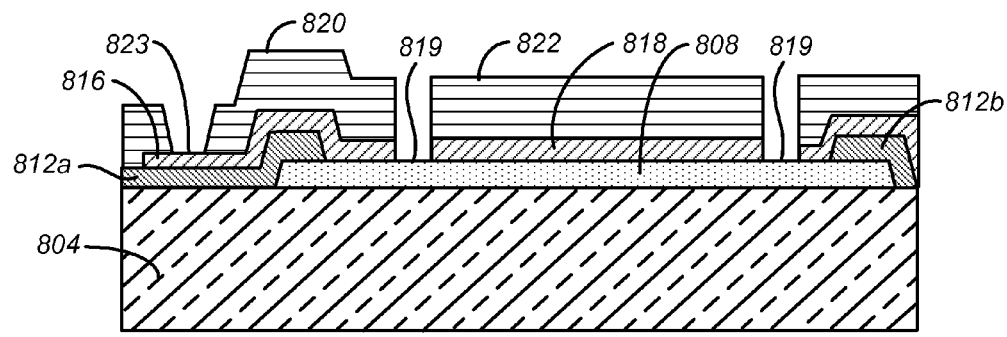
Figure 8E:
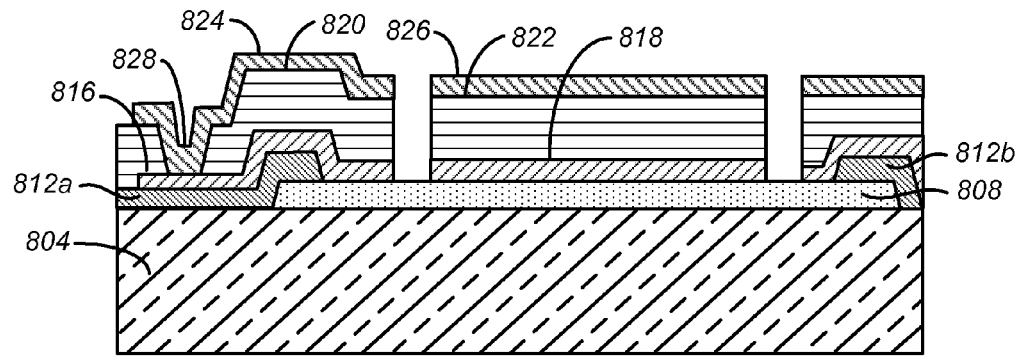
Figure 8F:
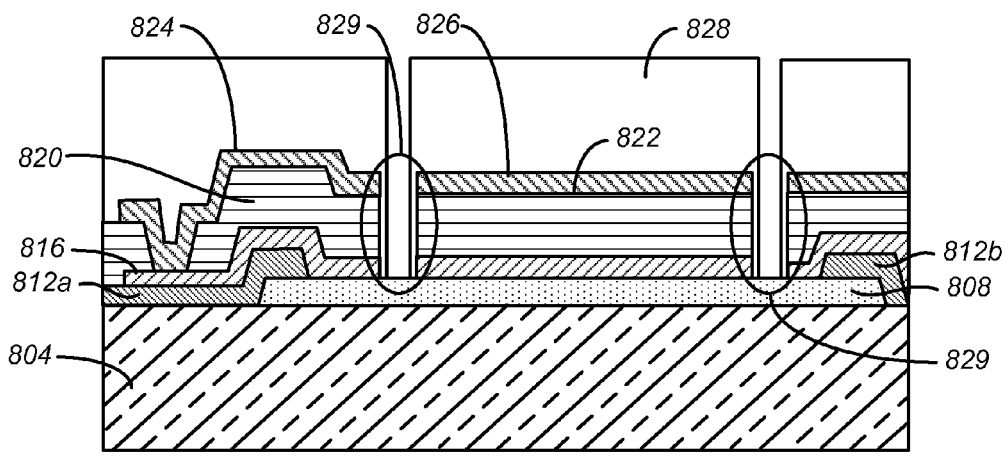
Figure 8G:
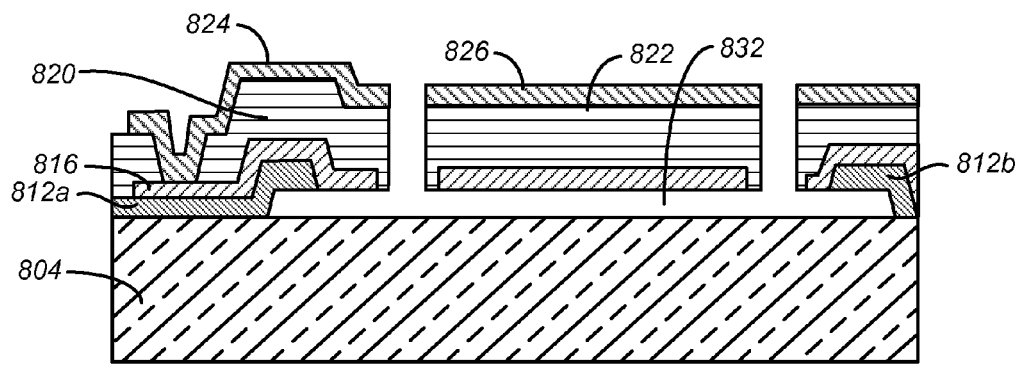
Figure 9A:
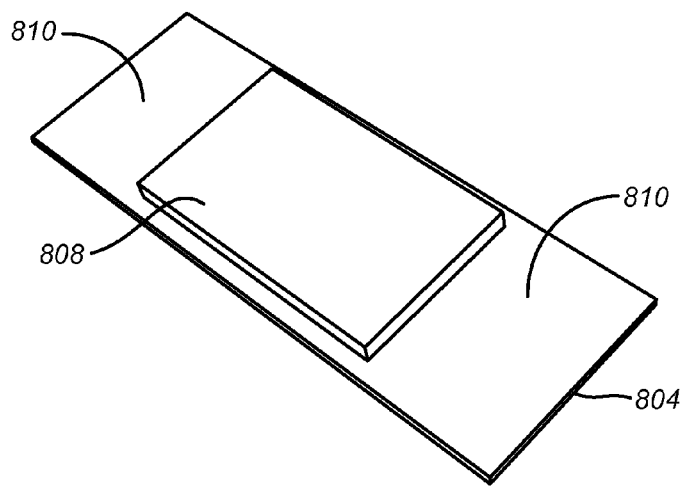
FIGS. 9A-9G show examples of perspective views of stages of staggered resonator fabrication in accordance with a process, for instance, as represented in FIG. 6 or FIG. 7.

In FIG. 7, the process 700 begins in block 704 in which a SAC layer 808 is deposited on a glass substrate 804, as shown in FIGS. 8A and 9A. To form the staggered structure of FIGS. 8 and 9, in block 708, SAC layer 808 is patterned using an appropriately shaped and aligned mask such that SAC layer 808 overlays a portion of substrate 804 and exposes end portions 810 of the surface of substrate 804 on respective ends of SAC layer 808. The SAC layer 808 defines a region in which a cavity will be formed to substantially isolate the resonator structure from the substrate 804, as further described below. The SAC layer 808 can be formed of silicon oxynitride (SiON), silicon oxide (SiOx), molybdenum (Mo), germanium (Ge), amorphous silicon (a-Si), poly-crystalline silicon, and/or various polymers, for example. In some implementations of the process 700, a suitable thickness of SAC layer 808 is in the range of about 0.5 micrometers (um) to 3 um. In one example, SAC layer 808 is formed of Mo and has a thickness of about 0.5 um.

Figure 9B:
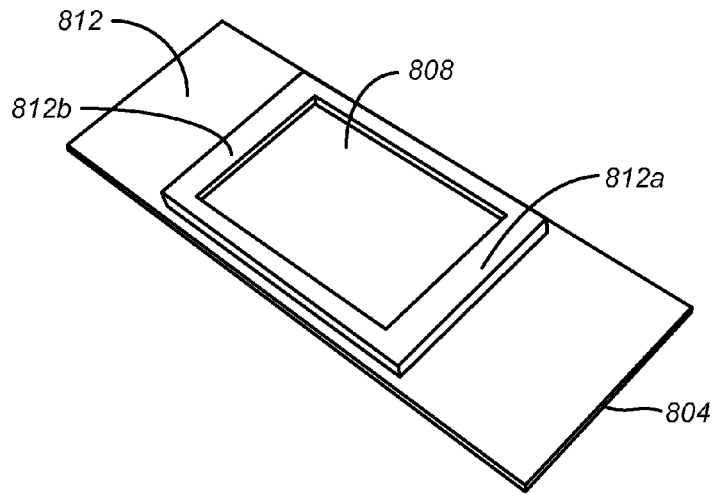

In block 712, a post oxide layer 812 is deposited over SAC layer 808 and exposed surface portions 810 of glass substrate 804. In block 716, to form the staggered structure of FIGS. 8 and 9, the post oxide layer 812 is patterned using an appropriate mask to expose a top portion of the sacrificial layer 808, as shown in FIGS. 8B and 9B. The remaining portions 812a and 812b of the post oxide layer define anchor structures on sides of the structure, as shown in FIGS. 8B and 9B, covering surface portions 810 of substrate 804. The post oxide layer 812 can be formed of materials such as SiOx and SiON and have a thickness, for example, on the order of about 1 um to 3 um. In some other implementations, post oxide layer 812 can be formed of nickel silicide (NiSi) or molybdenum silicide (MoSi$_2$). In some examples, post oxide layer 812 is about 0.5 um, or can be thicker, in the range of about 3 um to 5 um.

Figure 9C:
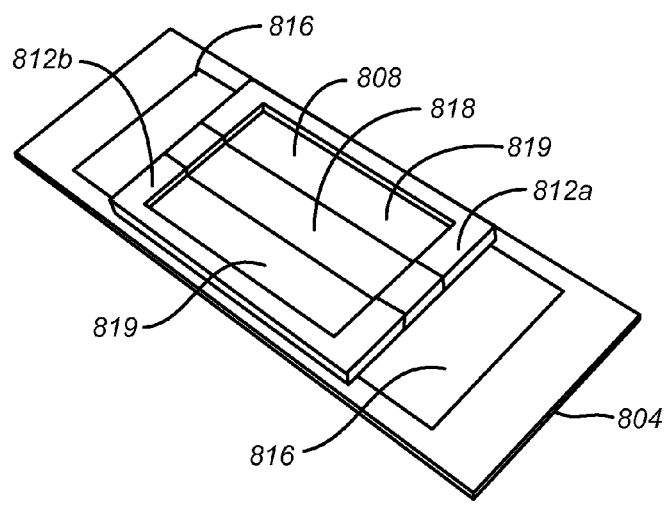
Figure 9D:
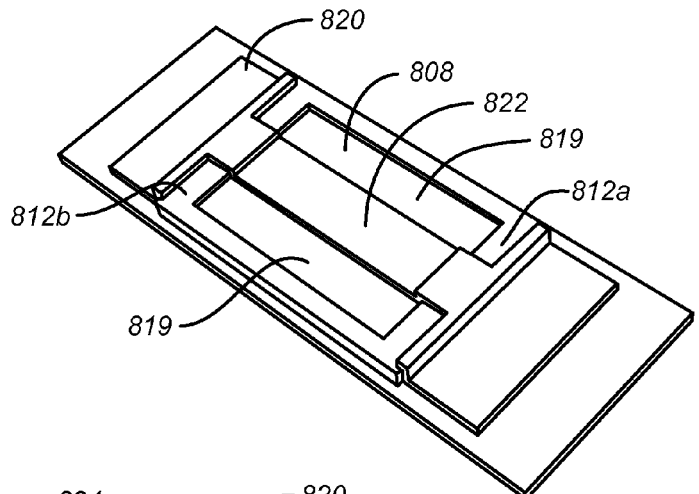

In block 720, a first metal layer 816 is deposited such that it overlays the post oxide anchors 812a and 812b as well as the exposed region of SAC layer 808. Metal layer 816 can be formed of aluminum (Al), Al/titanium nitride (TiN)/Al, aluminum copper (AlCu), Mo, or other appropriate materials, and have a thickness of 750 to 3000 Angstroms depending on the desired implementation. In some cases, the metal layer 816 is deposited as a bi-layer with a metal such as Mo deposited on top of a seed layer such as AlN. An appropriate thickness for the seed layer can be, for example, 100 to 1000 Angstroms. When Mo is used, the total thickness of the metal layer 816 can be about 3000 Angstroms. Other suitable materials for metal layer 816 include aluminum silicon (AlSi), AlCu, Ti, TiN, Al, platinum (Pt), nickel (Ni), tungsten (W), ruthenium (Ru), and combinations thereof. Thicknesses can range from about 0.1 um to 0.3 um, depending on the desired implementation. As shown in FIGS. 8C and 9C, in block 724, the first metal layer 816 is patterned using, for instance, an appropriate mask to define one or more lower electrodes 818. In some implementations, the one or more lower electrodes can be shaped to match overlaying upper electrodes. In the example of FIGS. 8C and 9C, metal layer 816 is formed to have a single electrode 818 in the shape of a strip, which extends laterally across the SAC layer 808 and exposes the SAC layer 808 on sides 819 of the strip, as shown in FIG. 9C.

The exposed areas 819 of the SAC layer 808 in FIG. 9C are shown as vias in the cross section depicted by FIGS. 8C-8G, for purposes of illustration.

In block 728, a piezoelectric layer, e.g., film 820, is deposited on the structure. In block 732, the piezoelectric film 820 is patterned using an appropriate mask such that strip 822 of the piezoelectric film 820 directly overlays the lower electrode portion 818, shown in FIGS. 8D and 9D. Again, as with the deposition and formation of the lower electrode layer 818, side areas 819 of the SAC layer 808 remain exposed from above. The piezoelectric layer can be formed of AlN and have a thickness, for example, between about 1 um and 2 um. In one example, an AlN piezoelectric film has a thickness of about 1.2 um. Piezoelectric film 820 is patterned at one end of the structure to have one or more vias 823, exposing a portion of the first metal layer 816 for conductive contact to be made to the first metal layer 816, as shown in FIG. 8D.

Figure 9E:
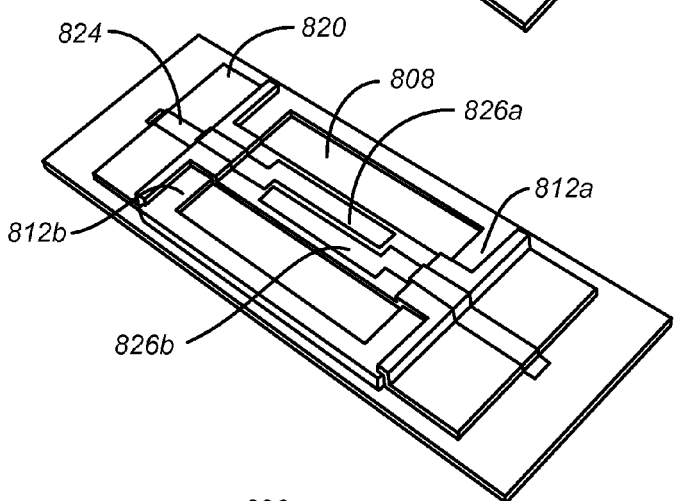

In FIG. 7, a second metal layer 824 is deposited and patterned, in blocks 736 and 740, to define upper electrodes 826, as shown in FIGS. 8E and 9E. The second metal layer 824 can be formed of AlCu, for example, as well as other materials as described above for forming the first metal layer 816. In one example, the second metal layer 824 is formed of AlCu, and has a thickness of about 2000 Angstroms. Other suitable thicknesses range from about 0.1 um to 0.3 um. As illustrated in FIG. 9E, when second metal layer 824 is patterned, in some implementations, a pair of adjacent electrodes 826a and 826b is formed. In one implementation, the electrodes 826a and 826b have longitudinal axes extending along the structure from opposite ends, as shown in FIG. 9E. Thus, the respective electrodes 826a and 826b can be connected to different ports, depending on the desired configuration of input and output signals using the resonator structure. In some implementations, a contact region 828 of the second metal layer 824 can be deposited in via 823 so the first and second metal layers are in conductive contact with one another.

Following the formation of the second metal layer 824, a release protection layer 828 such as AlOx can be deposited in block 744 using atomic layer deposition (ALD), physical vapor deposition (PVD), or other appropriate techniques and patterned in block 748 to protect sidewalls 829 of the electrodes in the first and second metal layers 816 and 824 and the sandwiched piezoelectric layer 820, as shown in FIG. 8F. Blocks 744 and 748 of FIG. 7 can be omitted in some implementations. In some implementations, the release protection layer 828 is patterned in block 748 to overlay the second metal layer 824, as shown in FIG. 8F. The side areas 819 remain exposed. The release protection layer 828 can be formed of SiON, and have a thickness of about 5000 Angstroms. The release protection layer 828 can then be removed after release of the SAC layer 808.

Figure 9F:
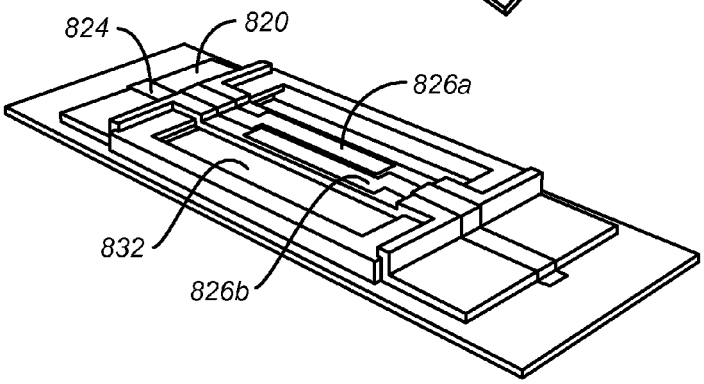
Figure 9G:
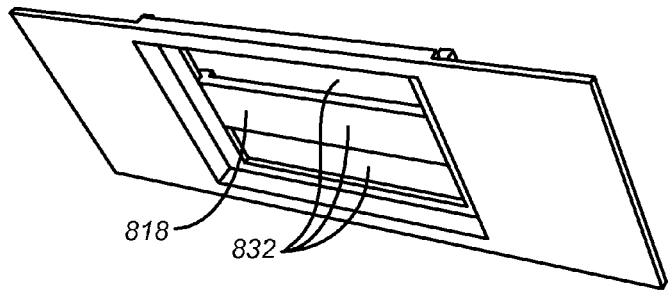

In block 752, the SAC layer 808 is then removed to define an air cavity 832, as shown in FIGS. 8G and 9F. In some implementations, the SAC layer 808 is released by exposing the structure to $XeF_2$ gas or $SF_6$ plasma, for instance, when the SAC layer 808 is formed of Mo or a-Si. HF can be used when the SAC layer 808 is formed of SiON or SiOx. FIG. 9G shows a perspective back view of the resulting resonator structure, with substrate 804 not shown to better illustrate cavity 832. The cavity 832 region is essentially defined by the absence of the SAC layer 808; thus, the cavity 832 includes side areas 819 and a portion underlying the first metal strip 818 of the resonator.

Following block 752, a metal interconnect layer can be deposited and patterned outside of the resonator structure to define transmission lines to the first and second metal layers 816 and 824. AlSi, AlCu, plated Cu, or other appropriate material can be used to form the metal interconnect layer.

Figure 10:
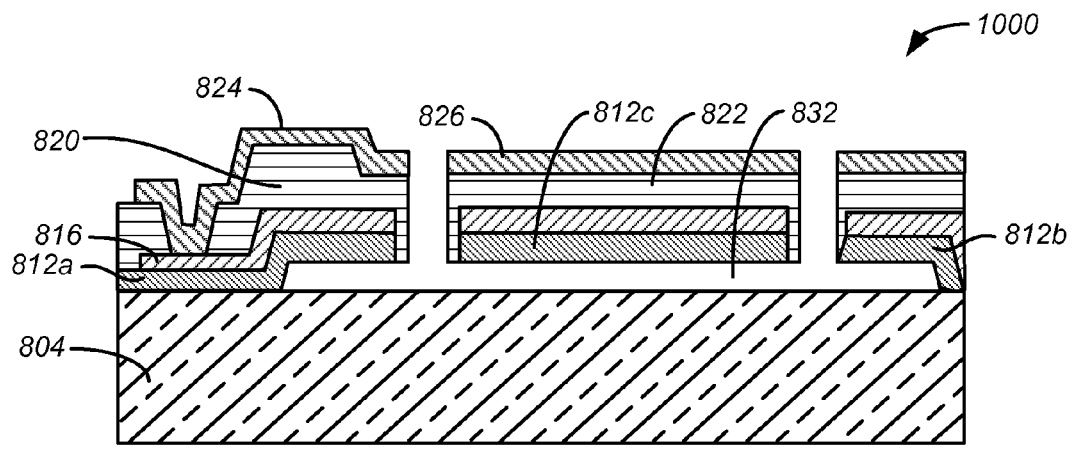
FIG. 10 shows an example of a cross-sectional schematic illustration of a temperature-compensated resonator structure.

FIG. 10 shows an example of a cross-sectional schematic illustration of a temperature-compensated resonator structure. The temperature compensated structure 1000 of FIG. 10 can be fabricated using the same processes as described above with respect to FIGS. 7-9, with a slight variation. Here, the post oxide layer 812 is patterned in block 716 such that a strip of the post oxide layer 812c remains and underlies the lower electrode(s) 818. In some implementations, the post oxide strip 812c is aligned with the overlaying lower electrode 818, the piezoelectric layer 822, and the upper electrodes 826 of the resonator structure. This strip 812c defines a temperature compensation layer for the resonator structure. The thickness of the post oxide layer 812 as a temperature compensation layer is often dependent on the choice of materials for the piezoelectric and electrode layers. In one case where the piezoelectric material is AlN, the electrodes are AlCu, Mo or a combination of both, and the post oxide layer is $SiO_2$, the thickness for the $SiO_2$ layer is of comparable magnitude to the thickness of the AlN layer.

In FIG. 10, the temperature compensation layer 812c provides resonators with a lower magnitude temperature-coefficient of frequency (TCF). This can be achieved by the selection of an appropriate material and layer thicknesses, as described above, for the post oxide layer 812, which serves as the thin-film compensation layer.

Figure 11:
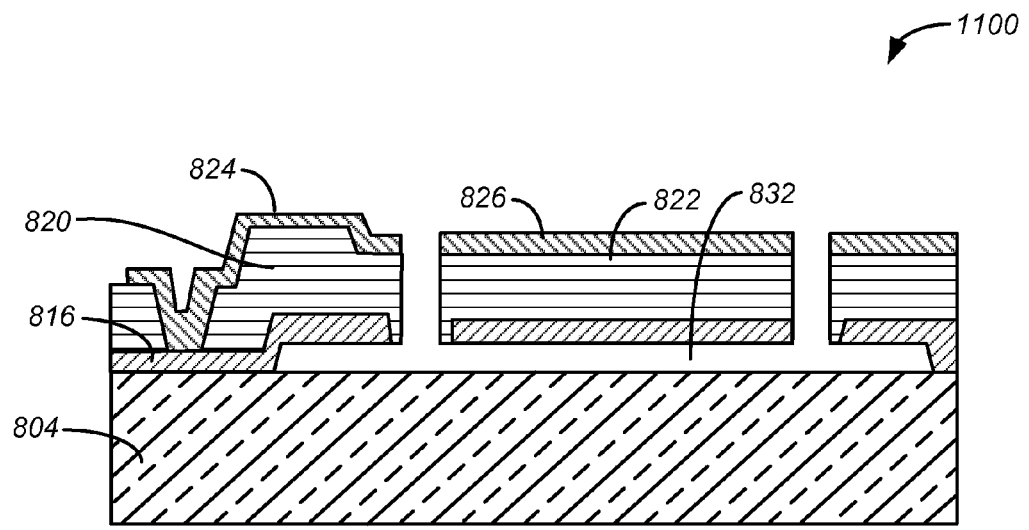
FIG. 11 shows an example of a cross-sectional schematic illustration of an airgap resonator structure.

FIG. 11 shows an example of a cross-sectional schematic illustration of an airgap resonator structure. The airgap structure 1100 of FIG. 11 also can be fabricated using essentially the same processes as described above with respect to FIGS. 7-9. Here, blocks 712 and 716 have been omitted, so that no post oxide layer is formed. The lower electrode layer is thus deposited and patterned in blocks 720 and 724 so that it directly overlays the SAC layer 808 and the exposed areas 810 of the substrate 804. The remaining fabrication blocks can be performed as described above with respect to FIGS. 7-9.

The piezoelectric materials that can be used in fabrication of the piezoelectric layers of electromechanical systems resonators disclosed herein include, for example, aluminum nitride, zinc oxide, gallium arsenide, aluminum gallium arsenide, gallium nitride, quartz and other piezoelectric materials such as zinc-sulfide, cadmium-sulfide, lithium tantalate, lithium niobate, lead zirconate titanate, members of the lead lanthanum zirconate titanate family, doped aluminum nitride (AlN:Sc), and combinations thereof. The conductive layers of upper and lower electrodes may be made of various conductive materials including platinum, aluminum, molybdenum, tungsten, titanium, niobium, ruthenium, chromium, doped polycrystalline silicon, doped AlGaAs compounds, gold, copper, silver, tantalum, cobalt, nickel, palladium, silicon germanium, doped conductive zinc oxide, and combinations thereof. In various implementations, the upper metal electrodes and/or the lower metal electrodes can include the same conductive material(s) or different conductive materials.

Figure 12A:
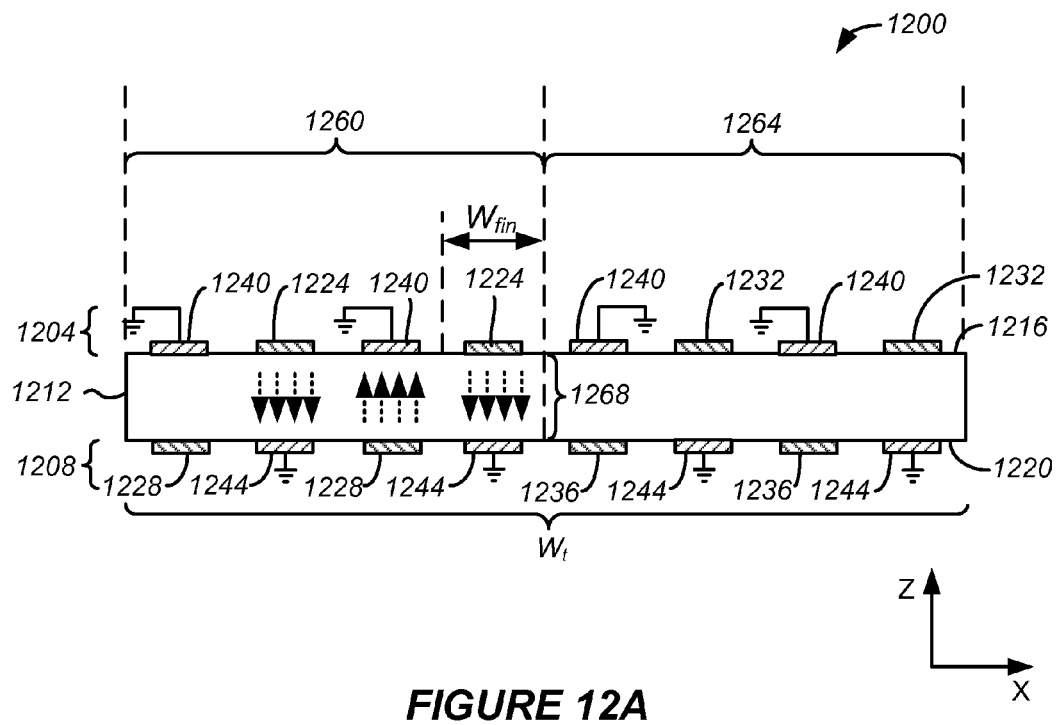
FIG. 12A shows an example of a side view of a resonator structure.

FIG. 12A shows an example of a side view of a resonator structure. In FIG. 12A, the resonator structure 1200 includes an upper conductive layer 1204 of electrodes disposed along an X axis. The resonator structure 1200 also includes a lower conductive layer 1208 of electrodes also disposed along the X axis and offset from the upper conductive layer 1204 along the Z axis. A piezoelectric layer 1212 is oriented along the X axis and disposed between the upper conductive layer 1204 and the lower conductive layer 1208. In this example, the piezoelectric layer 1212 has an upper surface 1216 and a lower surface 1220 opposite the upper surface 1216. As shown in the example of FIG. 12A, both the upper and lower surfaces 1216 and 1220 are generally oriented along the X axis. In this example, the upper surface 1216 is in contact with the upper conductive layer 1204, and the lower surface 1220 is in contact with the lower conductive layer 1208.

In FIG. 12A, the upper conductive layer 1204 includes signal electrodes, which refer to any electrodes coupled to receive or output signals. This can include both input electrodes and output electrodes. For instance, a signal electrode can refer to an input electrode coupled to receive an input signal, as well as an output electrode coupled to produce an output signal as described herein. In the example of FIG. 12A, the signal electrodes of the upper conductive layer 1204 include one or more input electrodes 1224 and one or more output electrodes 1232. The one or more input electrodes 1224 can be coupled to an input port as further explained below. While the example of FIG. 12A shows two input electrodes 1224, in other examples, the upper conductive layer 1204 includes a single input electrode 1224 or more than two input electrodes 1224. In FIG. 12A, the lower conductive layer 1208 also includes signal electrodes in the form of one or more input electrodes 1228 coupled to the input port and one or more output electrodes 1236 coupled to the output port. As with the upper conductive layer 1204, the lower conductive layer 1208 can include fewer or more input electrodes 1228 than the two electrodes illustrated in FIG. 12A.

In FIG. 12A, the upper conductive layer 1204 further includes ground electrodes 1240, while the lower conductive layer 1208 includes ground electrodes 1244. The ground electrodes 1240 in the upper conductive layer 1204 are interdigitated with the input electrodes 1224 and the output electrodes 1232, as shown in FIG. 12A. Similarly, the lower ground electrodes 1244 are interdigitated with the input electrodes 1228 and the output electrodes 1236, as shown in FIG. 12A. The various ground electrodes 1240 and 1244 can be coupled to a ground terminal as further explained below.

While FIG. 12A shows the upper conductive layer 1204 as including two input electrodes 1224, two output electrodes 1232, and four interdigitated ground electrodes 1240, in some examples, the structure 1200 can be modified to include fewer electrodes. For example, a resonator structure can include a single input electrode 1224, a single output electrode 1232, and a single ground electrode 1240 disposed between the input electrode 1224 and the output electrode 1232 in the upper conductive layer 1204. In this example, the lower conductive layer 1208 can have one ground electrode 1244 aligned with the input electrode 1224 and another ground electrode 1244 aligned with the output electrode 1232, and an input electrode 1228 or an output electrode 1236 aligned with the ground electrode 1240.

In FIG. 12A, the input electrodes 1228 of the lower conductive layer 1208 are offset from the input electrodes 1224 of the upper conductive layer 1204 along the X axis, and the output electrodes 1236 of the lower conductive layer 1208 are offset from the output electrodes 1232 of the upper conductive layer 1204 along the X axis. By the same token, in the example of FIG. 12A, the ground electrodes 1240 in the upper conductive layer 1204 are offset from the ground electrodes 1244 in the lower conductive layer 1208 along the X axis. In this example, the input electrodes 1224 and 1228 in the respective conductive layers 1204 and 1208 are offset from one another along the X axis such that individual input electrodes in one conductive layer are spaced apart from and facing individual ground electrodes in the other conductive layer. For example, input electrodes 1228 are aligned with ground electrodes 1240, while input electrodes 1224 are aligned with ground electrodes 1244. The output electrodes in resonator structure 1200 are similarly arranged. That is, individual output electrodes in one conductive layer are facing and spaced apart from individual ground electrodes in the other conductive layer. For example, output electrodes 1236 are aligned with ground electrodes 1240, while output electrodes 1232 are aligned with ground electrodes 1244. In this example, individual input and output electrodes in a conductive layer are aligned with individual ground electrodes in the opposite conductive layer along the Z axis.

Figure 12C:
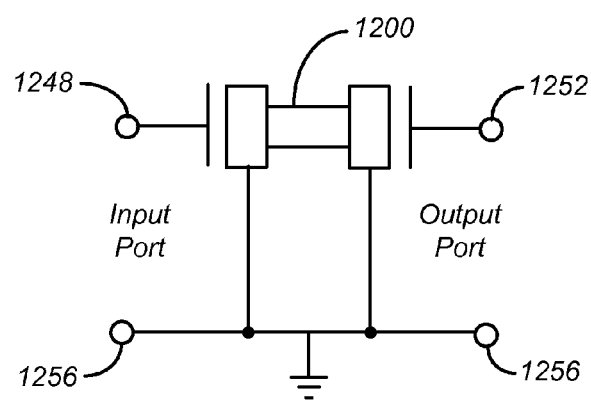
FIG. 12C shows an example of a simplified circuit diagram of the resonator structure of FIGS. 12A and 12B.
Figure 12B:
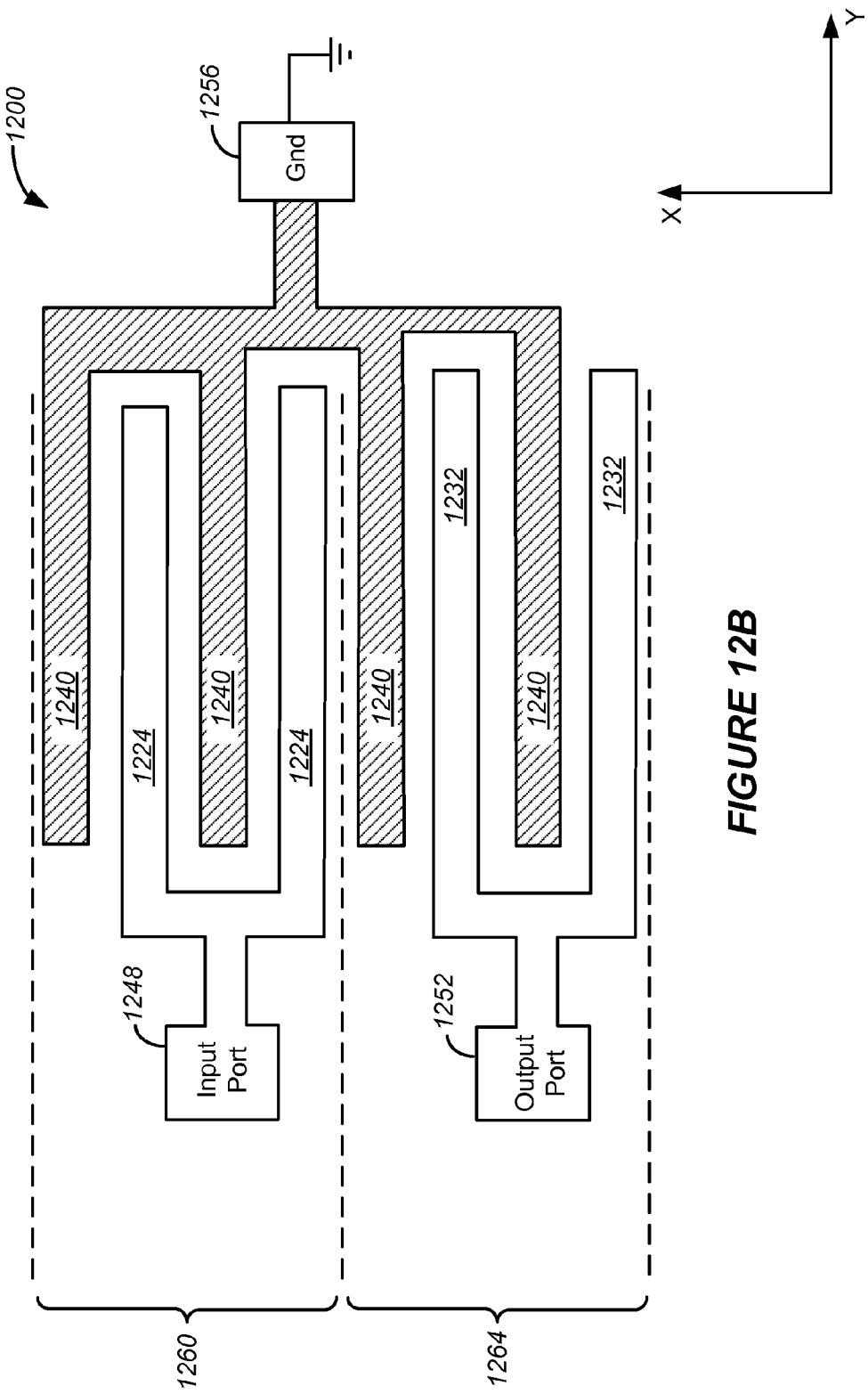
FIG. 12B shows an example of a top view of the resonator structure of FIG. 12A.

FIG. 12B shows an example of a top view of the resonator structure of FIG. 12A. In FIG. 12B, the input electrodes 1224 are coupled to a shared input port 1248, while the output electrodes 1232 are coupled to a shared output port 1252. The interdigitated ground electrodes 1240 are coupled to a shared ground terminal 1256. The electrodes in the lower conductive layer 1208 can be similarly coupled to shared ports.

In FIGS. 12A and 12B, the input electrodes 1224 and 1228 of the respective upper and lower conductive layers 1204 and 1208 are situated in a first region 1260 of the structured 1200 along the X axis. In this example, the output electrodes 1232 and 1236 of the respective conductive layers 1204 and 1208 are situated in a second region 1264 along the X axis. In this example, the input electrodes 1224 and 1228 and a portion of the sandwiched piezoelectric layer 1212 in the first region 1260 of the structure 1200 define a first sub-resonator of the structure 1200. The output electrodes 1232 and 1236 and a second portion of the sandwiched piezoelectric layer 1212 situated in the second region 1264 define a second sub-resonator of the structure 1200.

FIG. 12C shows an example of a simplified circuit diagram of the resonator structure of FIGS. 12A and 12B. FIG. 12C shows that resonator structure 1200 defines a two-port component, including input port 1248 and output port 1252, each illustrated as a terminal in this diagram. A third terminal is ground terminal 1256, with respect to which an input electrical signal can be applied at input port 1248, and an output electrical signal can be sensed at output port 1252.

Returning to FIGS. 12A and 12B, the resonator structure 1200 includes two groups of fingers: the input electrodes 1224 and 1228, and the output electrodes 1232 and 1236, with the input electrodes 1224 and 1228 situated in the first region 1260, and the output electrodes 1232 and 1236 situated in the second region 1264. The portion of the structure 1200 in region 1260 including the first group of electrodes 1224 and 1228 defines a first sub-resonator, and the portion of the structure 1200 in region 1264 including the second group of electrodes 1232 and 1236 defines a second sub-resonator. In FIGS. 12A-12C, the input electrodes 1224 and 1228 are coupled to input port 1248 for input actuation, e.g., receiving an AC signal, and the output electrodes 1232 and 1236 are coupled to output port 1252 for output sensing of electrical energy, as explained above.

In FIGS. 12A-12B, the two groups of fingers defining the respective sub-resonators are mechanically and acoustically coupled by virtue of the shared piezoelectric layer 1212. That is, the two sub-resonators in respective regions 1260 and 1264 are within a single mechanical body. The two sub-resonators also can be viewed as separate resonators, each having a portion of the piezoelectric layer 1212. The sub-resonators share a boundary 1268 in the piezoelectric layer between regions 1260 and 1264. Since the two sub-resonators are in contact with one another at boundary 1268 in shared piezoelectric layer 1212, the two sub-resonators mechanically interact with one another. For example, the two sub-resonators can experience mechanical movement and physical displacement in the form of the sub-resonators vibrating in phase or out of phase with each other.

In FIGS. 12A-12C, the arrangements of electrode(s) described above can cooperate with the piezoelectric layer 1212 to provide an electrical signal having two resonant frequencies. Thus, in some implementations, resonator structure 1200 can operate as a second order system.

Figure 13:
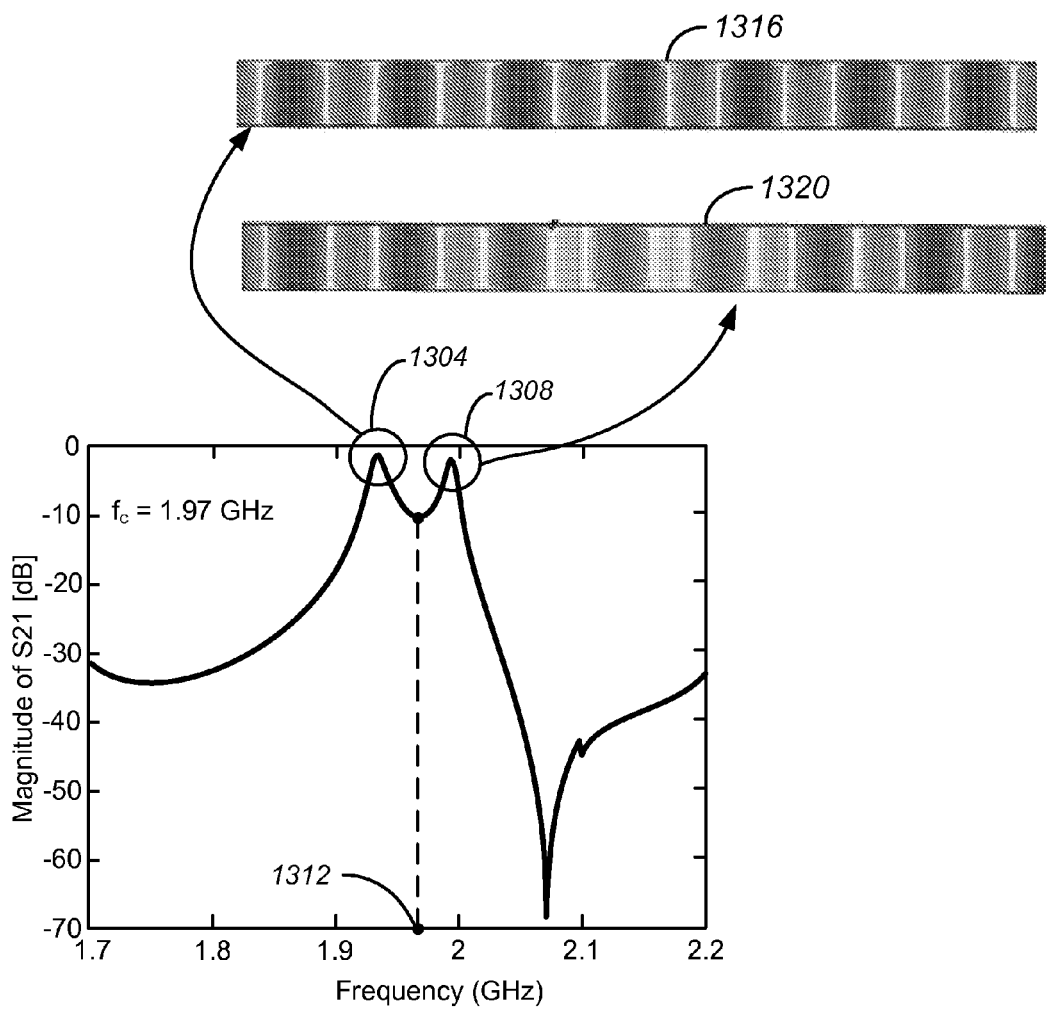
FIG. 13 shows an example of an electrical transmission response and corresponding vibration mode shapes of the resonator structure of FIGS. 12A-12C.

FIG. 13 shows an example of an electrical transmission response and corresponding vibration mode shapes of the resonator structure of FIGS. 12A-12C. In FIG. 13, the electrical transmission response (S21) represents an output electrical signal sensed at output port 1252 responsive to mechanical vibration of the structure 1200 when an input AC signal is provided to input port 1248 of the two-port structure 1200. The transmission response has two peaks 1304 and 1308. The first peak 1304 represents a lower resonant frequency of the structure 1200, and the second peak 1308 represents a higher resonant frequency of the same structure 1200. In this example, the lower resonant frequency is around 1.94 GHz, and the higher resonant frequency is around 2.0 GHz.

There are two resonant modes of the structure 1200, that is, in the form of the two resonant frequencies represented by peaks 1304 and 1308. This is due to the incorporation of the two sub-resonators in regions 1260 and 1264, respectively, of the single structure 1200. At resonance, an AC input signal delivered to input port 1248 and having a frequency coinciding with the natural resonant frequency of the structure 1200 causes the structure 1200 to vibrate. In one example of this second order system, in a first mode corresponding to the lower frequency of peak 1304, the sub-resonators vibrate in phase with one another, essentially moving in the manner of a single resonator. In a second mode corresponding to the higher frequency of peak 1308, the two sub-resonators vibrate out of phase with one another.

In FIG. 13, the separation of the two peaks 1304 and 1308 represents a difference between the higher resonant frequency and the lower resonant frequency of the structure 1200. A filter bandwidth of the structure 1200 can be defined by this difference. The finger width, Wfin, in the structure 1200 can be engineered to control, set, and adjust the resonant frequencies, and thus set the filter bandwidth. In some examples, Wfin directly determines the lower resonant frequency. In some examples, the higher resonant frequency is indirectly determined by Wfin and also affected by the manner in which an acoustic wave travels in structure 1200 back and forth along the X axis. A center frequency 1308 between the higher and lower resonant frequencies also can be determined by Wfin. In this example, the center frequency 1312 is about 1.97 GHz. The total width, Wt, of the structure also can be engineered to control, set, and adjust the filter bandwidth defined by the difference between the higher and lower resonant frequencies. This difference is an amount of separation between peaks 1304 and 1308 in the frequency domain. The finger width, Wfin, can be defined by layout and photolithography in fabrication of the structure. In some applications, as illustrated in FIG. 13, the resonant frequencies represented by peaks 1304 and 1308 can provide multiple frequency operation, e.g., from 10 MHz up to microwave frequencies on a single chip.

FIG. 13 also illustrates a lower vibration mode shape 1316 corresponding to the lower resonant frequency and an upper vibration mode shape 1320 corresponding to the upper resonant frequency. In the lower vibration mode shape 1316, the two sub-resonators can vibrate in phase with each other. In the upper vibration mode shape 1320, the two sub-resonators can vibrate out of phase with each other.

Returning to FIG. 12A, each sub-resonator has a total number, n, of fingers/electrodes associated with a respective port. In this example, the first sub-resonator has n=4 input electrodes 1224 and 1228 coupled to input port 1248 of FIGS. 12B and 12C, and the second sub-resonator has n=4 output electrodes 1232 and 1236 coupled to output port 1252. The total number of fingers connected to a particular port can be controlled to set the desired resonant frequencies and bandwidth. For instance, for a designated finger width, the total number, n, of input electrodes 1224 and 1228 can be increased to increase the total width of the resonator structure. The same is true for the total number of output electrodes 1232 and 1236.

Figure 14:
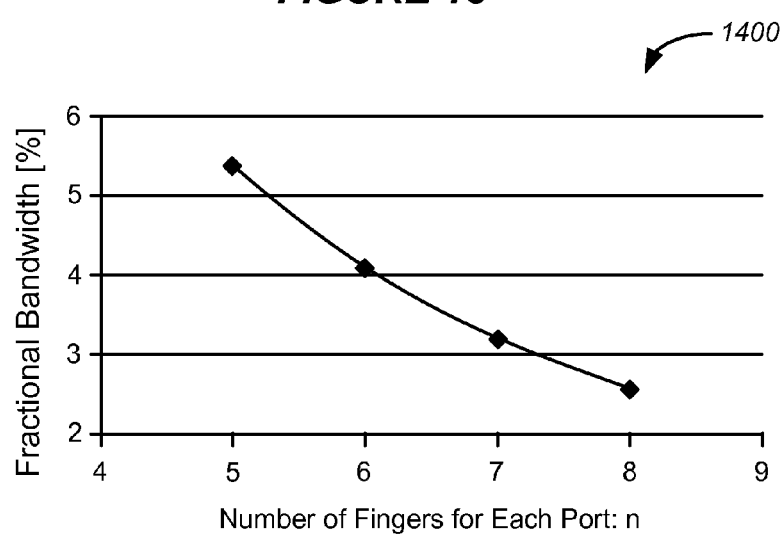
FIG. 14 shows an example of a fractional bandwidth of the resonator structure of FIGS. 12A-12C as a function of the number of fingers for each port.

FIG. 14 shows an example of a fractional bandwidth of the resonator structure of FIGS. 12A-12C as a function of the number of fingers for each port. In FIG. 14, simulated results show that the separation of the two peaks 1304 and 1308 of FIG. 13, representing the bandwidth of structure 1200 in terms of filter design, can be set according to the total width, Wt, of the resonator. Therefore, the fractional bandwidth 1400, i.e., bandwidth divided by center frequency 1312, also can be controlled according to the number of input and output electrodes of each port 1248 and 1252, when the finger width, Wfin, is fixed. In the examples shown and described above, FIG. 14 illustrates that the fractional bandwidth decreases in relation to an increase in the number of fingers of fixed width of a port, also corresponding to an increase in the total width of the structure 1200. Accordingly, the number of fingers can be engineered to achieve a designated bandwidth. Reducing the number of fingers can increase the fractional bandwidth, while increasing the number of fingers can cause the fractional bandwidth to be reduced.

The various resonator structures disclosed herein can be fabricated in manners providing for recessed areas such as a trench to be formed in the piezoelectric layer. For instance, a recessed area can be formed in a piezoelectric layer adjacent to an electrode, e.g., in a space between electrode regions, as explained in the examples below.

Figure 15:
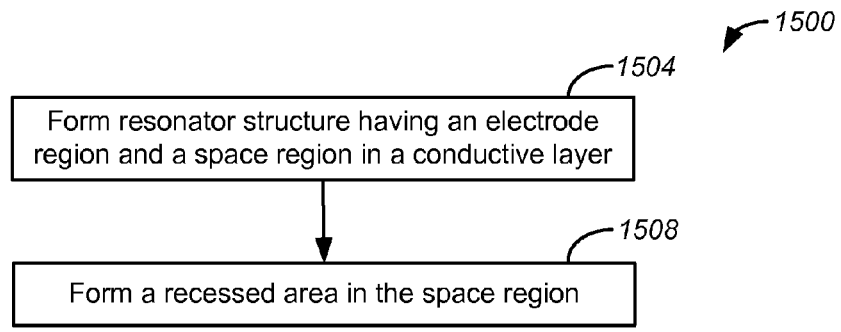
FIG. 15 shows an example of a flow diagram illustrating a process for forming a resonator structure.
Figure 16:
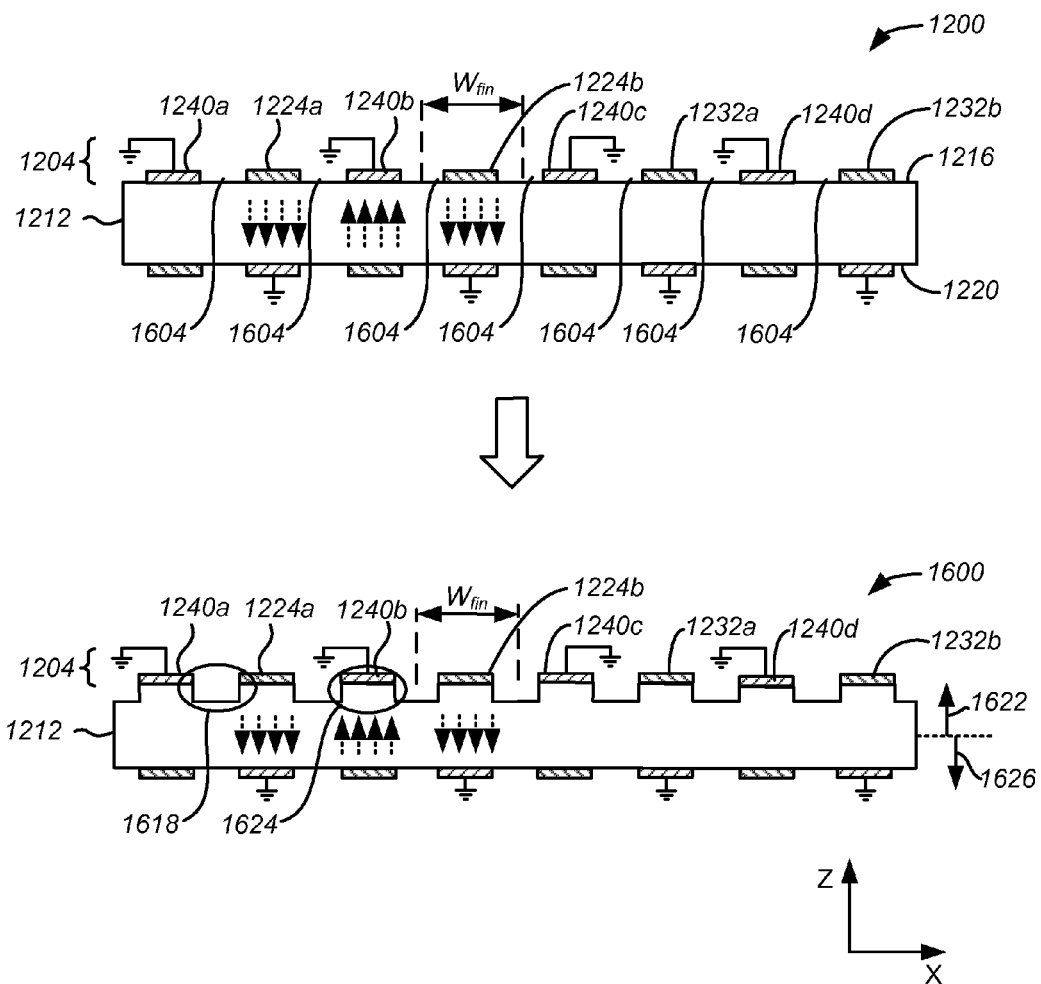
FIG. 16 shows an example of a side view of stages of resonator fabrication in accordance with a process, for instance, as represented in FIG. 15.

FIG. 15 shows an example of a flow diagram illustrating a process for forming a resonator structure. FIG. 16 shows an example of a side view of stages of resonator fabrication in accordance with a process, for instance, as represented in FIG. 15.

In FIG. 15, by way of example, resonator structure 1200 described above with respect to FIGS. 12A-12C can be fabricated in block 1504 of process 1500 using techniques described above in relation to FIGS. 6-11. In a conductive layer, the resonator structure 1200 can generally include one or more electrode regions and one or more space regions, that is, regions not occupied by electrodes, as explained above. As shown in FIG. 16, in the example of the structure 1200, the upper conductive layer 1204 includes electrode regions along the X axis occupied by electrodes 1224, 1232 and 1240. The space regions 1604 are defined as areas along the X axis between the electrode regions, where the upper surface 1216 portions of the piezoelectric layer 1212 are exposed.

In FIG. 15, following the formation of the resonator structure 1200 in block 1504, the process 1500 proceeds to block 1508 in which a recessed area is formed in one or more space regions. In the example of FIG. 16, a trench 1618 is formed in the piezoelectric layer 1212 in a space region 1604 between electrodes 1240a and 1224a. In this example, additional trenches are similarly formed in the piezoelectric layer 1212 in the space regions 1604 on an upper side 1622 of the structure, as illustrated. By forming the one or more trenches, one or more elevated regions such as region 1624 are defined in the piezoelectric layer 1212. Because the trenches are formed in the space regions 1604, the elevated regions are generally aligned with and underlying, in this example, electrode regions of the upper conductive layer 1204.

As explained in greater detail below, in some implementations, the trench(es) can be formed by performing a partial etching operation on exposed portions of the piezoelectric layer 1212, that is, areas not covered by electrodes. As a person having ordinary skill in the art will readily understand, trenches can similarly be formed on a lower side 1626 of the structure 1600. In some examples, one or more trenches as described above are formed in space regions 1604 on either the upper side 1622 or the lower side 1626 of the piezoelectric layer 1212, while in other examples, one or more trenches are formed on both the upper side 1622 and the lower side 1626.

Figure 17:
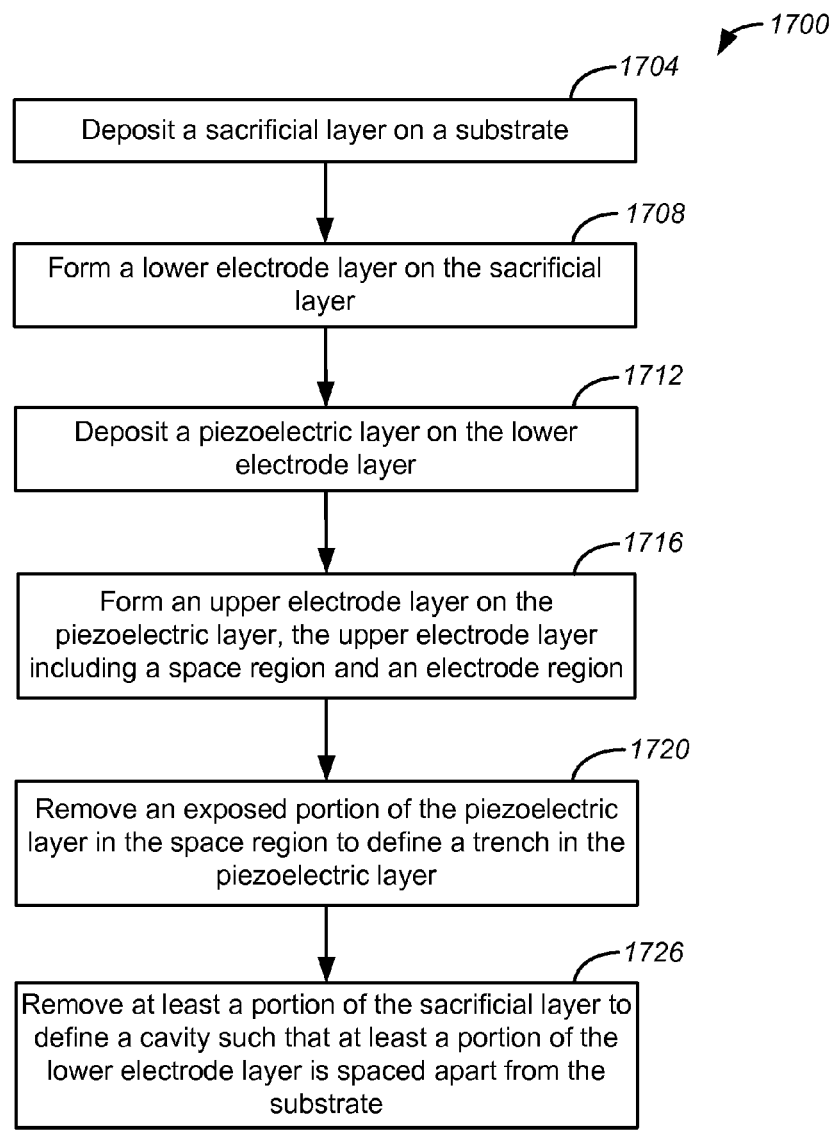
FIG. 17 shows an example of a flow diagram illustrating a process for forming a resonator structure.

FIG. 17 shows an example of a flow diagram illustrating a process for forming a resonator structure. FIGS. 18A-18E show examples of side views of stages of resonator fabrication in accordance with a process, for instance, as represented in FIG. 17.

Figure 18A:
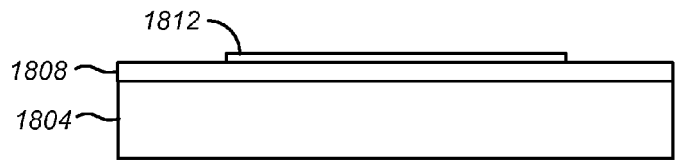
FIGS. 18A-18E show examples of side views of stages of resonator fabrication in accordance with a process, for instance, as represented in FIG. 17.

In FIG. 17, process 1700 begins in block 1704 in which a SAC layer 1808 as described above in relation to FIGS. 6-11 is deposited on a substrate 1804, as illustrated in FIG. 18A. In some implementations, the substrate 1804 can be an insulating substrate, examples of which are described above. In some other implementations, the substrate 1804 is formed of silicon. In block 1708, a lower electrode layer 1812 as described above in relation to FIGS. 6-11 is formed on the SAC layer 1808 and can be patterned to include one or more electrodes, depending on the desired configuration.

Figure 18B:
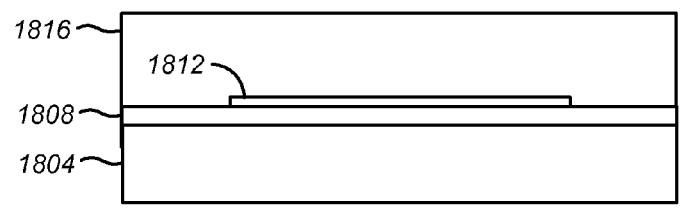
Figure 18C:
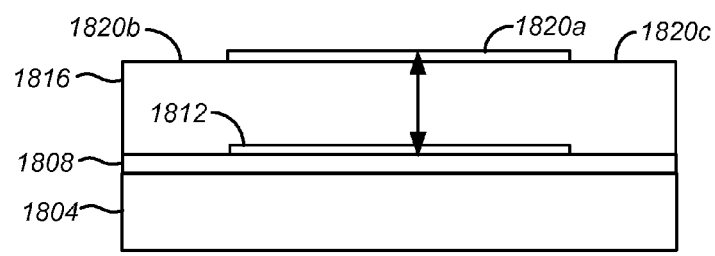

In block 1712, a piezoelectric layer 1816 as described above is deposited on the lower electrode layer 1812, as shown in FIG. 18B. In block 1716, an upper electrode layer 1820 is formed on the piezoelectric layer 1816, and can be patterned to include one or more electrode regions 1820*a* and one or more space regions 1820*b* and 1820*c*, as described above, and as illustrated in FIG. 18C. A person having ordinary skill in the art will readily recognize that the electrode regions 1820*a* and space regions 1820*b* and 1820*c* can have various dimensions according to desired finger widths and the total width of the resonator structure, as well as other parameters described above. In the depicted example, the electrode region 1820*a* is about 4.8 micrometers wide, while the space regions 1820*b* and 1820*c* are each about 0.8 micrometers wide. In this example, the finger width is about 6.4 micrometers.

Figure 18D:
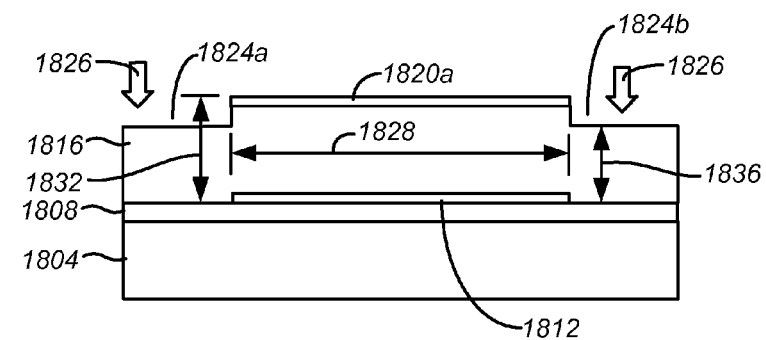
Figure 18E:
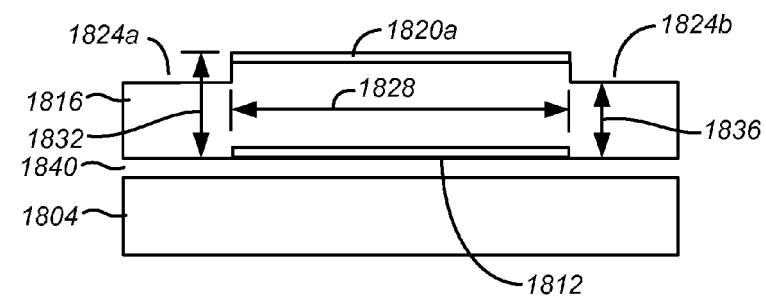

In block 1720, one or more exposed portions of the piezoelectric layer 1816 in the space regions 1820*b* and 1820*c* are removed to define trenches 1824*a* and 1824*b* in the piezoelectric layer 1816, as illustrated in FIG. 18D. In block 1720, exposed portions of the piezoelectric layer 1816 can be removed by partial etching illustrated by arrows 1826 to define recesses, e.g., in the form of trenches 1824*a* and 1824*b*. In some implementations, a mask can be provided over the electrode regions 1820*a* when performing this etching operation. In some other implementations, the electrode regions 1820*a* can serve as the mask. In some examples, such a trench defines an elevated region 1828 of the piezoelectric layer. The elevated region 1828 is generally aligned with the electrode region 1820*a* of the upper conductive layer 1820. The piezoelectric layer 1816 has a first height 1832 in the elevated region 1828 and a second height 1836 in the space regions 1820*b* and 1820*c*. The first height 1832 is larger than the second height 1836 to define a height differential, which can be set according to the desired implementation.

The depths of the trenches can be defined in terms of the first and second heights 1832 and 1836. A person having ordinary skill in the art will readily recognize that these heights can be set through experimentation to achieve optimal substantial suppression of spurious frequencies, and will depend on parameters such as the finger width(s) and total width of the resonator structure. In some implementations, an optimal ratio of the first and second heights exists, depending on the structural size and layout of the resonator, to achieve optimal performance. In one example, the height 1832 in the elevated region 1828 is approximately 1.2 micrometers, while the height 1836 in a space region 1820*b* or 1820*c* is approximately 0.7 micrometers.

In block 1726, at least a portion of the SAC layer 1808 is removed to define a cavity 1840 such that at least a portion of the lower electrode layer 1812 is spaced apart from the substrate 1804. The SAC layer 1808 also can be removed using techniques as described above in relation to FIGS. 6-11.

Figure 19:
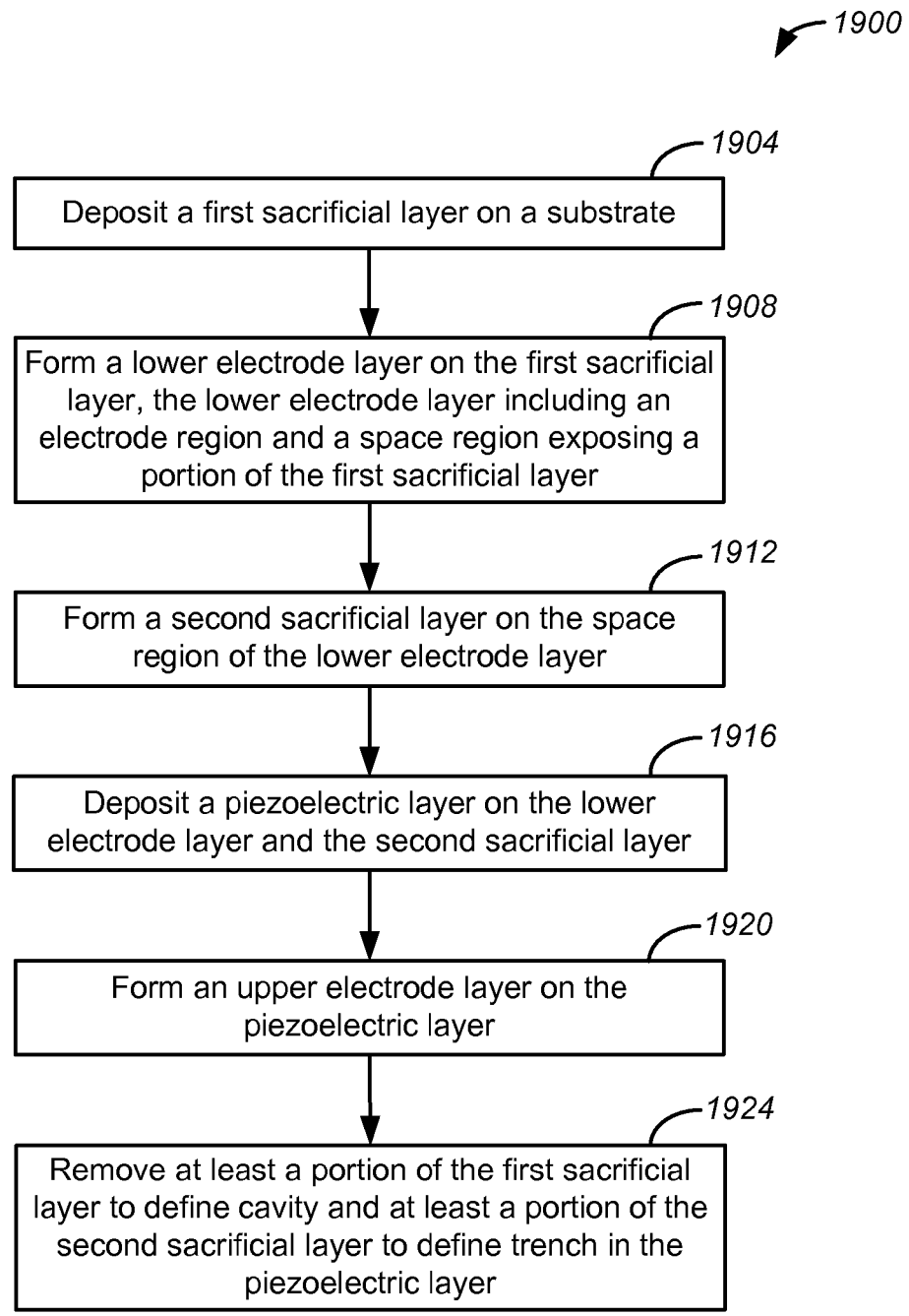
FIG. 19 shows an example of a flow diagram illustrating a process for forming a resonator structure.

FIG. 19 shows an example of a flow diagram illustrating a process for forming a resonator structure. FIGS. 20A-20E show examples of side views of stages of resonator fabrication in accordance with a process, for instance, as represented in FIG. 19.

Figure 20A:
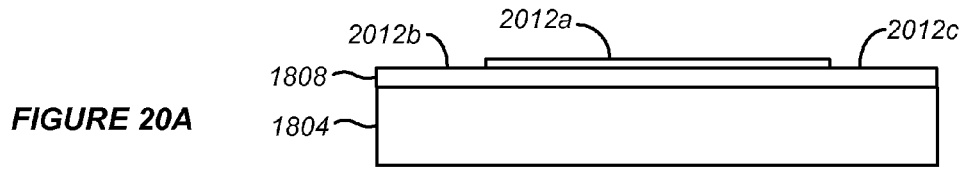
FIGS. 20A-20E show examples of side views of stages of resonator fabrication in accordance with a process, for instance, as represented in FIG. 19.

In FIG. 19, process 1900 begins in block 1904 in which a first SAC layer 1808 is deposited on a substrate 1804, as illustrated in FIG. 20A, and as described above. In block 1908, a lower electrode layer 2012 is formed on the SAC layer 1808 and can be patterned to include one or more electrodes, depending on the desired configuration. In this example, the electrode layer 2012 includes one or more electrode regions 2012*a* and one or more space regions 2012*b* and 2012*c*. The space regions 2012*b* and 2012*c* expose portions of the first SAC layer 1808.

Figure 20B:
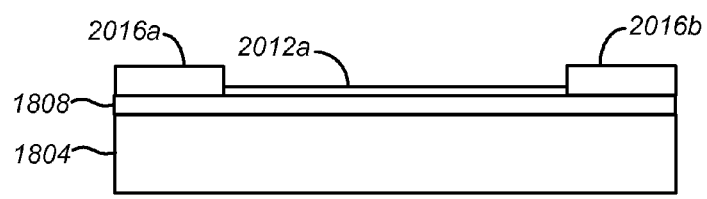
Figure 20C:
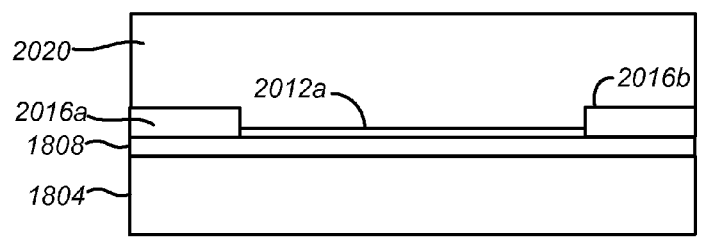
Figure 20D:
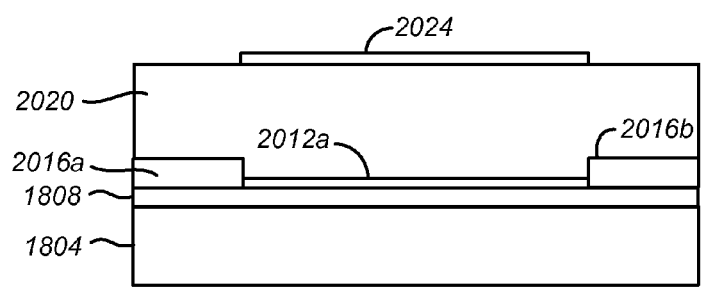

In block 1912, a second SAC layer 2016 in the form of SAC portions 2016*a* and 2016*b* is deposited in the space regions 2012*b* and 2012*c* of the lower electrode layer 2012, as shown in FIG. 20B. For instance, the electrode region 2012*a* can be masked when the second SAC layer 2016 is formed. In block 1916, a piezoelectric layer 2020 as described above is deposited on the lower electrode region 2016*a* and 2016*b*, as shown in FIG. 20C. In block 1920, an upper electrode layer 2024 as described above is formed on the piezoelectric layer 2020, as shown in FIG. 20D.

Figure 20E:
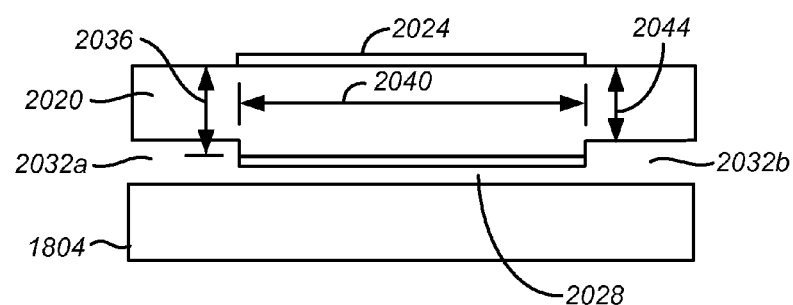

In block 1924, at least a portion of the first SAC layer 1808 and at least a portion of the second SAC layer 2016 are removed to define a cavity 2028 such that at least a portion of the lower electrode layer 2012 is spaced apart from the substrate. Also, removal of the second SAC layer 2016 defines trenches 2032*a* and 2032*b* in the piezoelectric layer 2020, as shown in FIG. 20E. The depths of the trenches 2032*a* and 2032*b* can be determined according to the thickness of the second SAC layer 2016 and set through experimentation to achieve optimal substantial suppression of spurious frequencies, as explained above.

In FIG. 20E, the piezoelectric layer 2020 has a first height 2036 in an elevated region 2040 and a second height 2044 aligned with the space regions 2012*b* and 2012*c* of the lower electrode layer. The first height 2036 can have a differential with respect to the second height 2044, as explained above.

Figure 21:
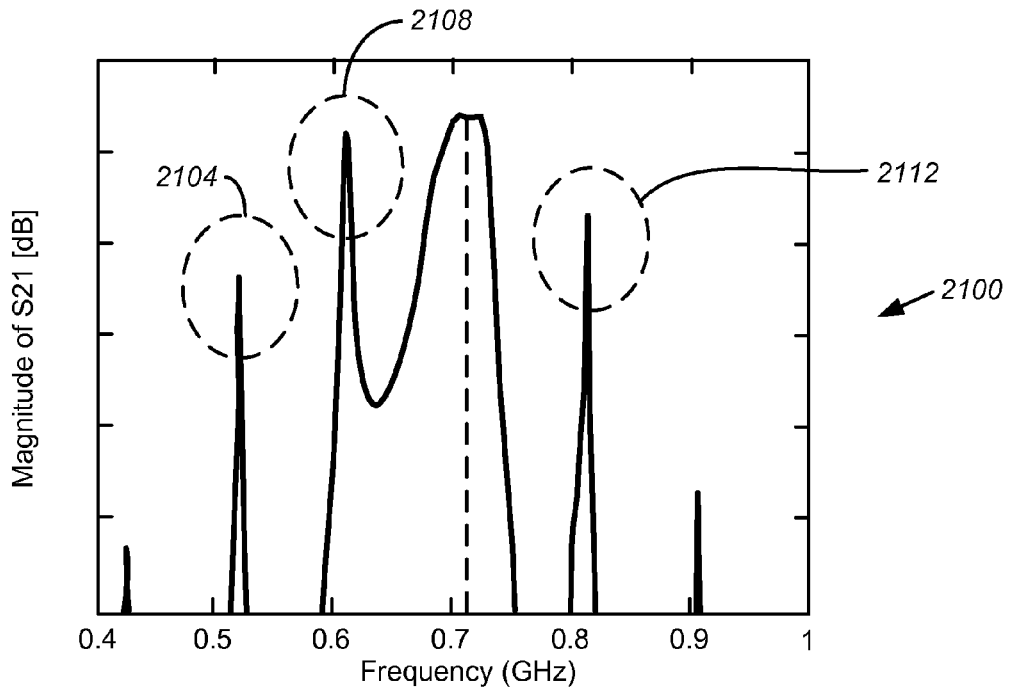
FIG. 21 shows an example of an electrical transmission response of a resonator structure.

FIG. 21 shows an example of an electrical transmission response of a resonator structure. In FIG. 21, spurious resonant frequencies are shown. These spurious frequencies are represented in the form of peaks 2104, 2108, and 2112. For example, in FIG. 21, the transmission response of the resonator is a pass band centered at about 0.7 GHz, and spurious frequencies at peaks 2104, 2108, and 2112 occur at about 0.5 GHz, 0.6 GHz, and 0.8 GHz, respectively.

Figure 22:
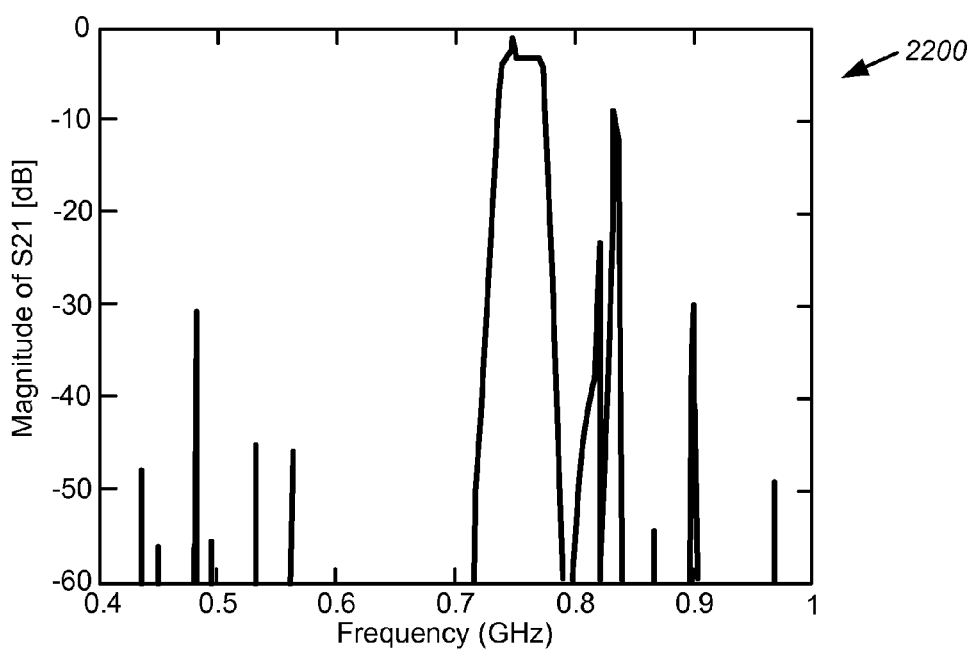
FIG. 22 shows an example of an electrical transmission response of a resonator structure having one or more recessed areas.

FIG. 22 shows an example of an electrical transmission response of a resonator structure having one or more recessed areas. In FIG. 22, when one of more of the disclosed techniques described above in relation to FIGS. 16-20 are performed, the spurious frequencies of peaks 2104 and 2108 can be substantially suppressed, as illustrated.

The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., electromechanical systems (EMS), MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the figures, but instead have wide applicability as will be readily apparent to one having ordinary skill in the art.

An example of a suitable electromechanical systems (EMS) or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

Figure 23A:
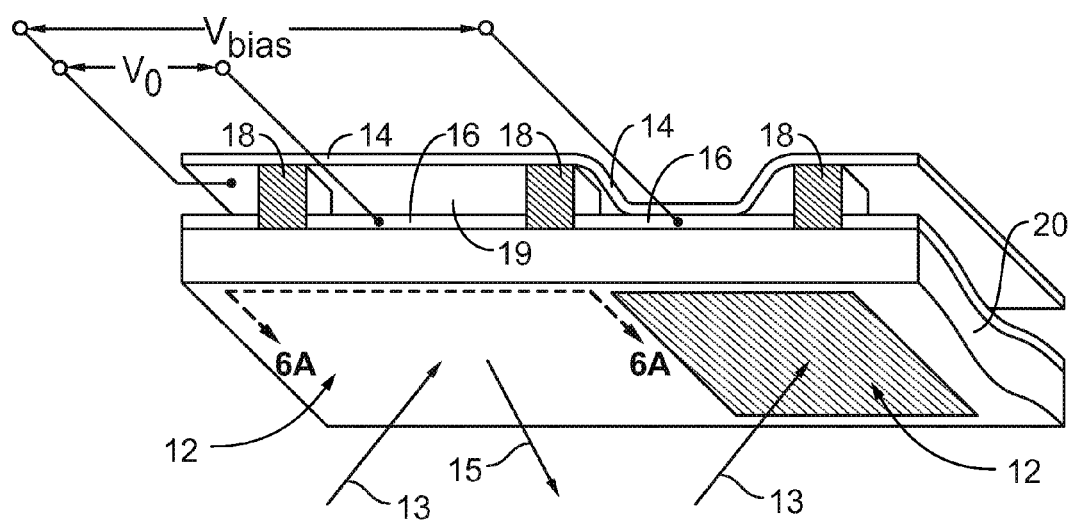
FIG. 23A shows an example of an isometric view depicting two adjacent pixels in a series of pixels of an interferometric modulator (IMOD) display device.

FIG. 23A shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 23A includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage V0 applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage Vbias applied across the IMOD 12 on the right is sufficient to maintain the movable reflective layer 14 in the actuated position.

In FIG. 23A, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the separation between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 23A, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 23A. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 23B:
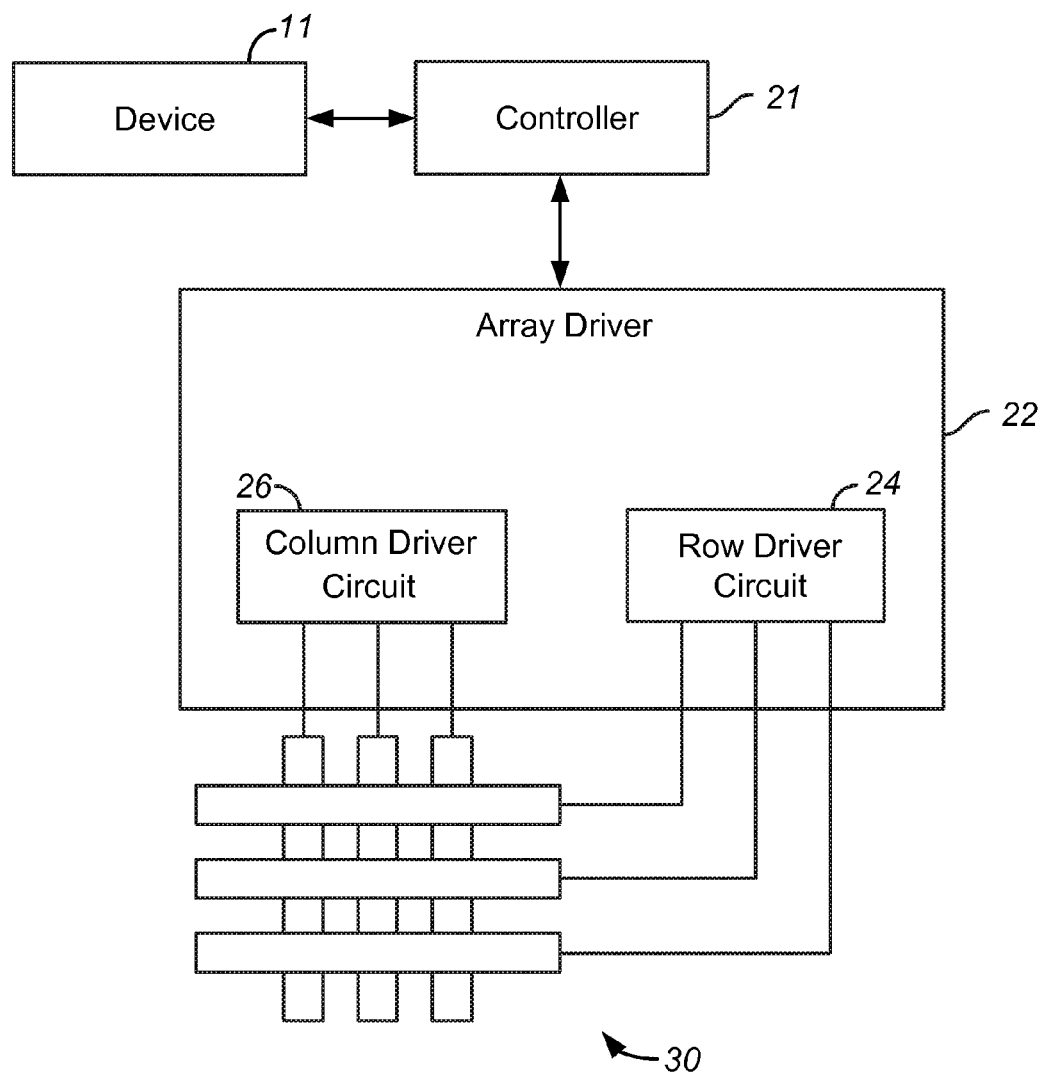
FIG. 23B shows an example of a system block diagram illustrating an electronic device incorporating an interferometric modulator display.

FIG. 23B shows an example of a system block diagram illustrating an electronic device incorporating a 3×3 interferometric modulator (IMOD) display. The electronic device of FIG. 23B represents one implementation in which a resonator device 11 constructed in accordance with the implementations described above with respect to FIGS. 1-22 can be incorporated. The electronic device in which device 11 is incorporated may, for example, form part or all of any of the variety of electrical devices and electromechanical systems devices set forth above, including both display and non-display applications.

Here, the electronic device includes a controller 21, which may include one or more general purpose single- or multichip microprocessors such as an ARM®, Pentium®, 8051, MIPS®, PowerPC®, or ALPHA®, or special purpose microprocessors such as a digital signal processor, microcontroller, or a programmable gate array. Controller 21 may be configured to execute one or more software modules. In addition to executing an operating system, the controller 21 may be configured to execute one or more software applications, including a web browser, a telephone application, an email program, or any other software application.

The controller 21 is configured to communicate with device 11. The controller 21 also can be configured to communicate with an array driver 22. The array driver 22 can include a row driver circuit 24 and a column driver circuit 26 that provide signals to, e.g., a display array or panel 30. Although FIG. 23B illustrates a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 24A:
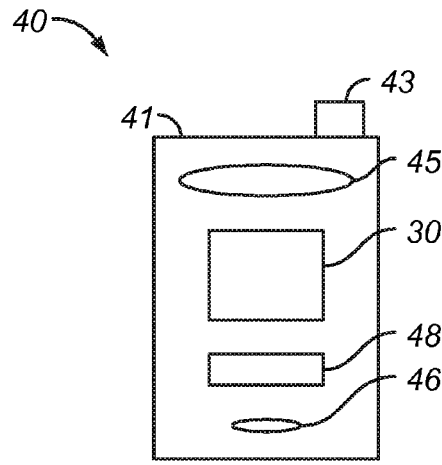
FIGS. 24A and 24B show examples of system block diagrams illustrating a display device that includes a plurality of interferometric modulators.
Figure 24B:
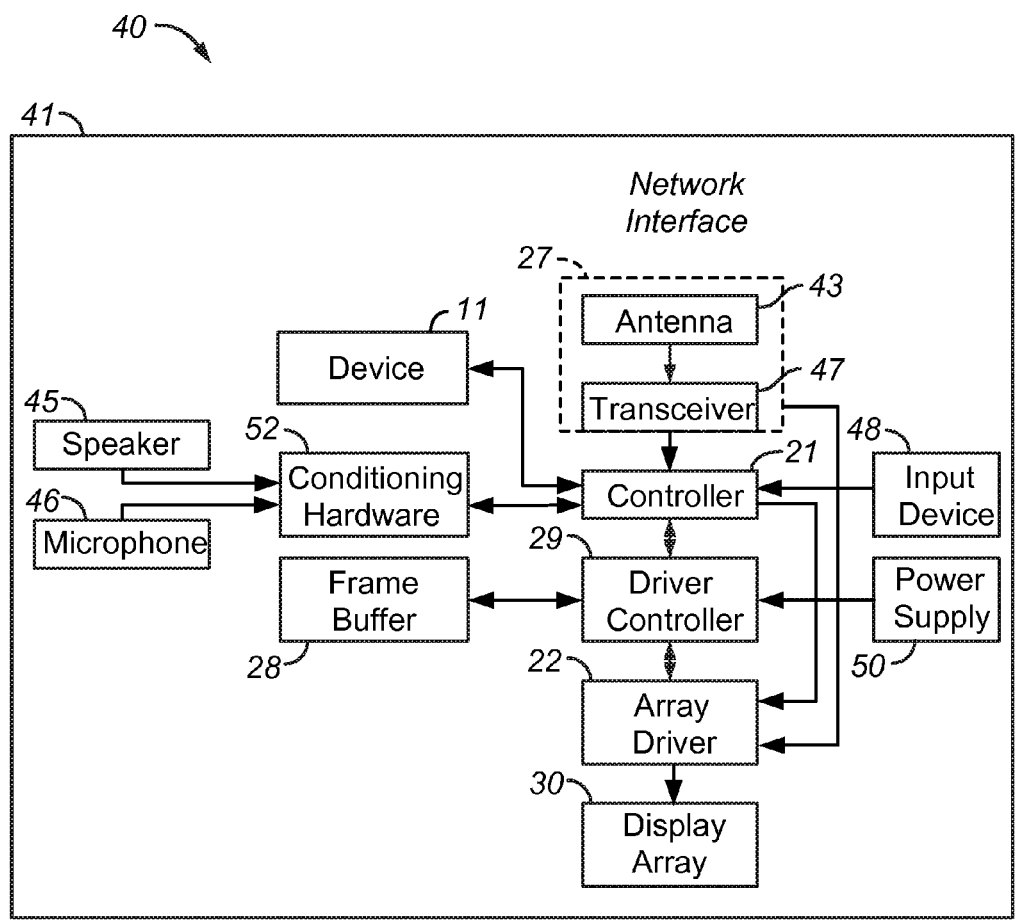

FIGS. 24A and 24B show examples of system block diagrams illustrating a display device 40 that includes a plurality of interferometric modulators. Display device 40 represents one example of an electronic device as described above. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 24B. The display device 40 includes a housing 41 and can include additional components at least partially enclosed therein. For example, the display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43. One or more of the resonator structures described above can be incorporated in transceiver 47.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level. Controller 21 is also configured to interact with device 11 to perform desired operations.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components. In one implementation, device 11 is incorporated as a component of conditioning hardware 52.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A resonator structure comprising:
   a first conductive layer of electrodes disposed along an X axis;
   a second conductive layer of electrodes disposed along the X axis and offset from the first conductive layer along a Z axis perpendicular to the X axis; and
   a piezoelectric layer including a piezoelectric material, the piezoelectric layer disposed between the first conductive layer and the second conductive layer, the piezoelectric layer having a first side and a second side opposite the first side, the first side proximate the first conductive layer, the second side proximate the second conductive layer;
   one or more trenches being formed in the piezoelectric layer on the first side in one or more respective space regions between the electrodes of the first conductive layer, the one or more trenches each having a depth configured to facilitate suppression of one or more spurious frequencies outside of a pass band of the resonator structure.

2. The resonator structure of claim 1, wherein the one or more trenches define elevated regions on the first side of the piezoelectric layer, the elevated regions being aligned with the electrodes of the first conductive layer.

3. The resonator structure of claim 2, wherein the piezoelectric layer has a first height along the Z axis in one of the elevated regions and a second height along the Z axis in one of the space regions, the first height being larger than the second height.

4. The resonator structure of claim 3, wherein the first height and the second height of the piezoelectric layer define the depth.

5. The resonator structure of claim 2, wherein the elevated regions of the piezoelectric layer have planar dimensions along the X and Y axes substantially matching planar dimensions along the X and Y axes of the electrodes of the first conductive layer.

6. The resonator structure of claim 1, wherein the one or more trenches in the piezoelectric material are formed by an etching operation.

7. The resonator structure of claim 1, further including one or more second trenches formed in the piezoelectric layer on the second side in one or more respective space regions between the electrodes of the second conductive layer.

8. The resonator structure of claim 7, wherein the one or more second trenches define elevated regions of the piezoelectric layer on the second side, the one or more second trenches on the second side being aligned with the one or more trenches on the first side of the piezoelectric layer, the elevated regions on the second side being aligned with the elevated regions on the first side of the piezoelectric layer.

9. The resonator structure of claim 8, wherein the piezoelectric layer has a first height along the Z axis in one of the elevated regions and a second height along the Z axis in one of the space regions.

10. The resonator structure of claim 1, wherein the piezoelectric material is selected from the group consisting of: aluminum nitride, zinc oxide, gallium arsenide, aluminum gallium arsenide, gallium nitride, quartz, zinc-sulfide, cadmium-sulfide, lithium tantalate, lithium niobate, and lead zirconate titanate.

11. The resonator structure of claim 1 further comprising:
one or more tethers coupled to anchor the layers to a supporting apparatus.

12. The resonator structure of claim 1 further comprising:
a display;
a processor configured to communicate with the display, the processor being configured to process image data; and
a memory device configured to communicate with the processor.

13. The structure of claim 12 further comprising:
a driver circuit configured to send at least one signal to the display; and
a controller configured to send at least a portion of the image data to the driver circuit.

14. The structure of claim 12, wherein one or more of the output electrodes are coupled to send the image data to the processor.

15. A resonator structure comprising:
first conductive means of electrodes disposed along an X axis;
second conductive means of electrodes disposed along the X axis and offset from the first conductive means along a Z axis perpendicular to the X axis; and
piezoelectric means including a piezoelectric material, the piezoelectric means disposed between the first conductive means and the second conductive means, the piezoelectric means having a first side and a second side opposite the first side, the first side proximate the first conductive means, the second side proximate the second conductive means;
one or more trenches being formed in the piezoelectric means on the first side in one or more respective space regions between the electrodes of the first conductive means, the one or more trenches each having a depth configured to facilitate suppression of one or more spurious frequencies outside of a pass band of the resonator structure.

16. The resonator structure of claim 15, wherein the one or more trenches define elevated regions on the first side of the piezoelectric means, the elevated regions being aligned with the electrodes of the first conductive means.

17. The resonator structure of claim 16, wherein the piezoelectric means has a first height along the Z axis in one of the elevated regions and a second height along the Z axis in one of the space regions, the first height being larger than the second height.

18. The resonator structure of claim 17, wherein the first height and the second height of the piezoelectric means define the depth.

19. The resonator structure of claim 16, wherein the elevated regions of the piezoelectric means have planar dimensions along the X and Y axes substantially matching planar dimensions along the X and Y axes of the electrodes of the first conductive means.

20. The resonator structure of claim 15, further including one or more second trenches formed in the piezoelectric means on the second side in one or more respective space regions between the electrodes of the second conductive means.

21. The resonator structure of claim 20, wherein the one or more second trenches define elevated regions of the piezoelectric means on the second side, the one or more second trenches on the second side being aligned with the one or more trenches on the first side of the piezoelectric means, the elevated regions on the second side being aligned with the elevated regions on the first side of the piezoelectric means.

22. The resonator structure of claim 21, wherein the piezoelectric means has a first height along the Z axis in one of the elevated regions and a second height along the Z axis in one of the space regions.

23. The resonator structure of claim 15, wherein the piezoelectric material is selected from the group consisting of: aluminum nitride, zinc oxide, gallium arsenide, aluminum gallium arsenide, gallium nitride, quartz, zinc-sulfide, cadmium-sulfide, lithium tantalate, lithium niobate, and lead zirconate titanate.

24. The resonator structure of claim 15 further comprising:
one or more tethering means coupled to anchor the piezoelectric means to a supporting apparatus.

* * * * *